US00RE49545E

(19) United States
(12) Reissued Patent
Kim et al.

(10) Patent Number: US RE49,545 E
(45) Date of Reissued Patent: Jun. 6, 2023

(54) SEMICONDUCTOR DEVICE INCLUDING POLYGON-SHAPED STANDARD CELL

(71) Applicant: SAMSUNG ELECTRONICS CO., LTD., Suwon-si (KR)

(72) Inventors: JinTae Kim, Daejeon (KR); Jaewan Choi, Suwon-si (KR)

(73) Assignee: SAMSUNG ELECTRONICS CO., LTD., Suwon-si (KR)

(21) Appl. No.: 17/175,381

(22) Filed: Feb. 12, 2021

Related U.S. Patent Documents

Reissue of:
(64) Patent No.: 10,204,920
Issued: Feb. 12, 2019
Appl. No.: 15/095,579
Filed: Apr. 11, 2016

(30) Foreign Application Priority Data

Apr. 9, 2015 (KR) ..... 10-2015-0050150
Oct. 21, 2015 (KR) ..... 10-2015-0146730

(51) Int. Cl.
*H01L 27/118* (2006.01)
*H01L 27/02* (2006.01)

(52) U.S. Cl.
CPC .... *H01L 27/11807* (2013.01); *H01L 27/0207* (2013.01); *H01L 2027/11859* (2013.01);
(Continued)

(58) Field of Classification Search
CPC ..... H01L 27/11807; H01L 27/0207; H01L 27/0886; H01L 27/088; H01L 29/0847;
(Continued)

(56) References Cited

U.S. PATENT DOCUMENTS 6,054,872 A 4/2000 Fudanuki et al.
6,536,028 B1 3/2003 Katsioulas et al.
(Continued)

FOREIGN PATENT DOCUMENTS

CN 101118909 A 2/2008
CN 101752368 A 6/2010
(Continued)

OTHER PUBLICATIONS

Notice of Allowance in U.S. Appl. No. 16/450,383, dated Feb. 24, 2021.
(Continued)

*Primary Examiner* — Tuan H Nguyen
(74) *Attorney, Agent, or Firm* — Sughrue Mion, PLLC

(57) ABSTRACT

A semiconductor device including a standard cell for implementing a logic element includes a first active region and a second active region extending in a second direction on a substrate and spaced apart from each other in a first direction perpendicular to the second direction, gate electrodes intersecting the first active region and the second active region, and source regions and drain regions formed on the first and second active regions at both sides of each of the gate electrodes. A boundary of the standard cell has a polygonal shape, excluding a quadrilateral shape, when viewed in a plan view. As a result, an area of the standard cell may be reduced to reduce a size of the semiconductor device.

64 Claims, 25 Drawing Sheets

(52) U.S. Cl.
CPC ..... *H01L 2027/11874* (2013.01); *H01L 2027/11881* (2013.01); *H01L 2027/11885* (2013.01)

(58) Field of Classification Search
CPC ..... H01L 29/41791; H01L 2027/11874; H01L 2027/11885; H01L 2027/11859; H01L 2027/11881
See application file for complete search history.

(56) References Cited

U.S. PATENT DOCUMENTS

| | | | |
|---|---|---|---|
| 7,039,881 | B2 | 5/2006 | Regan |
| 7,117,457 | B2 | 10/2006 | Frenkil |
| 7,299,440 | B2 | 11/2007 | Yoshida et al. |
| 7,302,660 | B2 | 11/2007 | Shimamura |
| 7,321,139 | B2 | 1/2008 | Chang et al. |
| 7,888,705 | B2 | 2/2011 | Becker et al. |
| 7,919,792 | B2 | 4/2011 | Law et al. |
| 7,943,998 | B2 | 5/2011 | Yun et al. |
| 7,989,849 | B2 | 8/2011 | Sherlekar et al. |
| 8,063,414 | B2 | 11/2011 | Uchida |
| 8,173,491 | B2 | 5/2012 | Law et al. |
| 8,176,457 | B2 | 5/2012 | Kato et al. |
| 8,220,696 | B2 | 7/2012 | Kawada |
| 8,239,807 | B2 | 8/2012 | Arora et al. |
| 8,255,837 | B2 | 8/2012 | Lu et al. |
| 8,327,301 | B2 | 12/2012 | Cheng et al. |
| 8,357,955 | B2 | 1/2013 | Tanaka |
| 8,513,978 | B2 | 8/2013 | Sherlekar |
| 8,584,052 | B2 | 11/2013 | Chen et al. |
| 8,612,914 | B2 | 12/2013 | Sherlekar et al. |
| 8,647,893 | B1 | 2/2014 | Agarwal et al. |
| 8,661,392 | B2 | 2/2014 | Quandt et al. |
| 8,729,606 | B2 | 5/2014 | Becker et al. |
| 8,732,628 | B1 | 5/2014 | Wu et al. |
| 8,739,095 | B2 | 5/2014 | Cao et al. |
| 8,788,998 | B2 | 7/2014 | Hatamian et al. |
| 8,863,063 | B2 | 10/2014 | Becker et al. |
| 8,935,639 | B1 | 1/2015 | Tzeng |
| 8,949,749 | B2 | 2/2015 | Wang et al. |
| 8,959,472 | B1 | 2/2015 | Frederick, Jr. et al. |
| 9,007,060 | B2 | 4/2015 | Ausserlechner |
| 9,098,670 | B2 | 8/2015 | Song et al. |
| 10,242,985 | B2 | 3/2019 | Shimbo |
| 2002/0005572 | A1 | 1/2002 | Hatanaka |
| 2003/0084418 | A1 | 5/2003 | Regan |
| 2005/0198604 | A1 | 9/2005 | Yoshida et al. |
| 2006/0138464 | A1 | 6/2006 | Shimamura |
| 2007/0111405 | A1* | 5/2007 | Watanabe ..... H01L 27/0207 438/142 |
| 2007/0234243 | A1 | 10/2007 | Kyoh |
| 2007/0284618 | A1 | 12/2007 | Chang et al. |
| 2007/0300202 | A1 | 12/2007 | Uchida |
| 2008/0111158 | A1 | 5/2008 | Sherlekar et al. |
| 2008/0211056 | A1 | 9/2008 | Kuroda et al. |
| 2008/0223502 | A1 | 9/2008 | Kawada |
| 2008/0263500 | A1 | 10/2008 | Kato et al. |
| 2009/0026503 | A1 | 1/2009 | Tsuda |
| 2009/0032898 | A1 | 2/2009 | Becker et al. |
| 2009/0121208 | A1 | 5/2009 | Nagashima et al. |
| 2010/0006896 | A1 | 1/2010 | Uemura |
| 2010/0155783 | A1 | 6/2010 | Law et al. |
| 2010/0187626 | A1 | 7/2010 | Becker |
| 2010/0196803 | A1 | 8/2010 | Lu et al. |
| 2010/0199253 | A1 | 8/2010 | Cheng et al. |
| 2011/0049575 | A1 | 3/2011 | Tanaka |
| 2011/0084312 | A1 | 4/2011 | Quandt et al. |
| 2011/0145775 | A1 | 6/2011 | Sano |
| 2011/0219341 | A1 | 9/2011 | Cao et al. |
| 2011/0296366 | A1 | 12/2011 | Arora et al. |
| 2012/0167021 | A1 | 6/2012 | Chen et al. |
| 2012/0241986 | A1 | 9/2012 | Sherlekar et al. |
| 2012/0249182 | A1 | 10/2012 | Sherlekar |
| 2013/0021026 | A1 | 1/2013 | Ausserlechner |
| 2013/0207199 | A1 | 8/2013 | Becker et al. |
| 2014/0065728 | A1 | 3/2014 | Agarwal et al. |
| 2014/0115546 | A1 | 4/2014 | Wang et al. |
| 2014/0181774 | A1 | 6/2014 | Hatamian et al. |
| 2014/0217513 | A1* | 8/2014 | Hayashi ..... H01L 27/0928 257/369 |
| 2014/0304671 | A1 | 10/2014 | Lu et al. |
| 2014/0380256 | A1 | 12/2014 | Song et al. |
| 2015/0035065 | A1 | 2/2015 | Park et al. |
| 2015/0095857 | A1 | 4/2015 | Hsu et al. |
| 2016/0056155 | A1* | 2/2016 | Park ..... H01L 29/0642 257/401 |
| 2016/0283634 | A1 | 9/2016 | Kim et al. |

FOREIGN PATENT DOCUMENTS

| | | | |
|---|---|---|---|
| CN | 103647290 | A | 3/2014 |
| CN | 104425509 | A | 3/2015 |
| JP | 8-213466 | A | 8/1996 |
| JP | 9-185641 | A | 7/1997 |
| JP | 11-3943 | A | 1/1999 |
| JP | 2001-244342 | A | 9/2001 |
| JP | 2003-529210 | A | 9/2003 |
| JP | 2004-165443 | A | 6/2004 |
| JP | 2011-124423 | A | 6/2011 |
| JP | 2012-28479 | A | 2/2012 |
| JP | 5151313 | B2 | 2/2013 |
| JP | 2013-73139 | A | 4/2013 |
| JP | 2014-236116 | A | 12/2014 |
| JP | 5758815 | B2 | 8/2015 |
| KR | 10-0846089 | B1 | 7/2008 |
| KR | 1020090050004 | A | 5/2009 |
| KR | 10-0935125 | B1 | 1/2010 |
| KR | 1020130019688 | A | 2/2013 |
| KR | 10-2015-0035405 | A | 4/2015 |
| KR | 10-1532858 | B1 | 6/2015 |
| TW | 200620486 | A | 6/2006 |
| WO | 2015033490 | A1 | 3/2015 |

OTHER PUBLICATIONS

Corrected Notice of Allowability in U.S. Appl. No. 16/450,383 notified on Apr. 5, 2021.
Physical Library Analysis for Optimal 28-nm and 20-nm Routing (Version 3.0), Jul. 2013.
Communication dated Feb. 10, 2017 issued by the U.S. Patent and Trademark Office in counterpart U.S. Appl. No. 15/094,586.
"Physical Library Analysis for Optimal 28-nm and 20-nm Routing (Version 3.0)", Router CAE, SYPNOSYS Accelerating Innovation, Jul. 15, 2013, pp. 1-63.

* cited by examiner

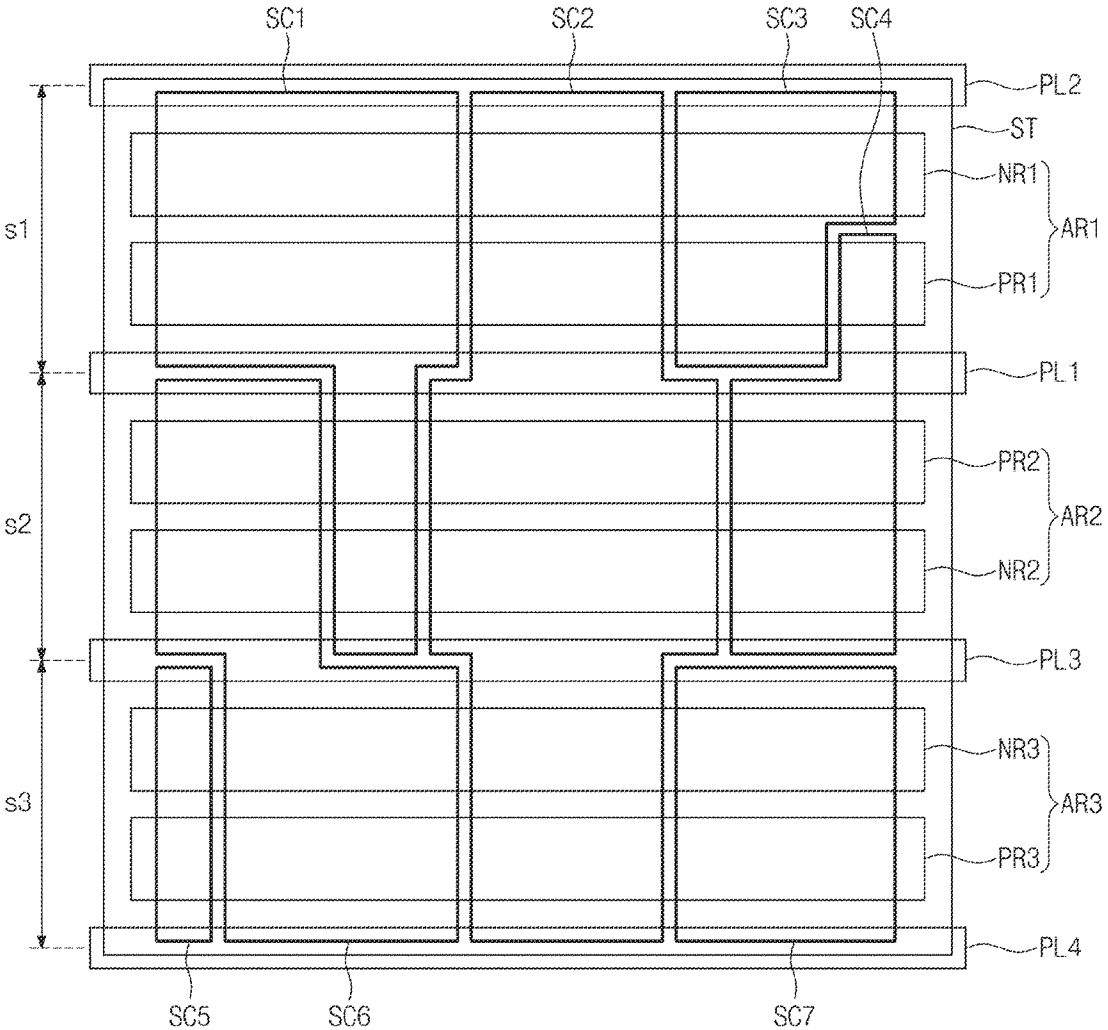
FIG. 19
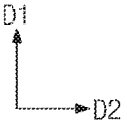

SEMICONDUCTOR DEVICE INCLUDING POLYGON-SHAPED STANDARD CELL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This is a reissue application of U.S. Pat. No. 10,204,920, which was filed as U.S. application Ser. No. 15/095,579 on Apr. 11, 2016 and issued on Feb. 12, 2019, the disclosure of which is hereby incorporated by reference in its entirety.*

CROSS-REFERENCE TO RELATED APPLICATIONS

This application claims priority from Korean Patent Application Nos. 10-2015-0050150 and 10-2015-0146730, filed on Apr. 9, 2015 and Oct. 21, 2015, respectively, in the Korean Intellectual Property Office. The disclosures of the above-listed applications are hereby incorporated by reference in their entireties.

BACKGROUND

Apparatuses and methods consistent with exemplary embodiments to a semiconductor device including a standard cell having a polygonal shape.

Semiconductor devices have been highly integrated and circuits of semiconductor devices have been complicated. Thus, it may be very difficult to manually design a layout of a semiconductor device. Accordingly, in the related art, a semi-custom method of designing a layout of a semiconductor device using a computer may be used. In the semicustom method, standard cells for performing logic functions may be provided to a cell library of a design tool in advance and a layout may be designed using the same. For example, the standard cell may have a rectangular shape.

As circuit design techniques of semiconductor devices have been developed, relatively large-sized standard cells have been demanded. However, if a size of a standard cell increases, an area of an unused region in the standard cell may also increase to cause an increase in size of a semiconductor device. Thus, reconfiguration of a standard cell may be needed to reduce a size of a semiconductor device.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments may provide a semiconductor device including a standard cell having a polygonal shape excluding a quadrilateral shape.

According to an aspect of an exemplary embodiment, a semiconductor device including a standard cell for implementing a logic element may include a first active region including a first PMOS region and a first NMOS region that extend in a first direction on a substrate and are spaced apart from each other in a second direction perpendicular to the first direction, a second active region including a second PMOS region and a second NMOS region that extend in the first direction on the substrate and are spaced apart from each other in the second direction, gate electrodes intersecting the first active region and the second active region, first source regions and first drain regions formed on the first active region at both sides of each of the gate electrodes, and second source regions and second drain regions formed on the second active region at both sides of each of the gate electrodes. A boundary of the standard cell, which includes a plurality of edges, may have a polygonal shape excluding a quadrilateral shape when viewed from a plan view.

The semiconductor device may further include a first power line extending in the first direction between the first active region and the second active region when viewed from a plan view, a second power line extending in the first direction, and a third power line extending in the first direction. The first active region may include one edge adjacent to the first power line and another edge opposite to the one edge, and the second power line may be adjacent to the another edge of the first active region. The second active region may include one edge adjacent to the first power line and another edge opposite to the one edge, and the third power line may be adjacent to the another edge of the second active region. The boundary of the standard cell may overlap with the first power line, the second power line, and the third power line.

The standard cell may include a first region having a quadrilateral shape and overlapping with the first power line, the second power line, and the third power line, and a second region having a quadrilateral shape and overlapping with the first power line and the third power line. The second region may be in contact with the first region.

The standard cell may further include a third region having a quadrilateral shape and overlapping with the first power line and the third power line. The first region may include a first edge being in contact with the second region and a second edge opposite to the first edge, and the third region may be in contact with the second edge of the first region.

The standard cell may further include a fourth region having a quadrilateral shape and overlapping with the first power line and the second power line. The first region may include a first edge being in contact with the second region and a second edge opposite to the first edge, and the fourth region may be in contact with the second edge of the first region.

The standard cell may further include a fifth region having a quadrilateral shape and overlapping with the first power line, the second power line, and the third power line. The second region may include a first edge being in contact with the first region and a second edge opposite to the first edge, and the fifth region may be in contact with the second edge of the second region.

The first PMOS region the second PMOS region may be adjacent to the first power line.

The semiconductor device may further include a third active region adjacent to the third power line on the substrate, the third active region including a third PMOS region and a third NMOS region that extend in the first direction and are spaced apart from each other in the second direction, the gate electrodes further extending to intersect the third active region, third source regions and third drain regions formed on the third active region at both sides of each of the gate electrodes, and a fourth power line extending in the first direction. The third active region may include one edge adjacent to the third power line and another edge opposite to the one edge, and the fourth power line may be adjacent to the another edge of the third active region. The standard cell may further include a sixth region having a quadrilateral shape and overlapping with the third power line and the fourth power line. The sixth region may be in contact with the first region.

The second NMOS region and the third NMOS region ay be adjacent to the third power line.

According to an aspect of an exemplary embodiment, a semiconductor device including a standard cell for implementing a logic element may include an NMOS region and a PMOS region extending in a first direction on a substrate and spaced apart from each other in a second direction perpendicular to the first direction, gate electrodes intersecting the NMOS region and the PMOS region, and source regions and drain regions formed on the NMOS region and PMOS region at both sides of each of the gate electrodes. A boundary of the standard cell, which includes a plurality of edges, may have a polygonal shape excluding a quadrilateral shape.

The semiconductor device may further include a first power line extending in the first direction and adjacent to an edge of the NMOS region, and a second power line extending in the first direction and adjacent to an edge of the PMOS region. The NMOS region and the PMOS region may be disposed between the first power line and the second power line when viewed from a plan view.

The standard cell may include a first region having a quadrilateral shape and overlapping with the first power line and the second power line; and a second region having a quadrilateral shape and overlapping with the second power line and the PMOS region. The second region may be in contact with the first region.

The standard cell may further include a third region having a quadrilateral shape and overlapping with the second power line and the PMOS region. The first region may include a first edge being in contact with the second region and a second edge opposite to the first edge, and the third region may be in contact with the second edge of the first region.

The standard cell may further include a fourth region having a quadrilateral shape and overlapping with the first power line and the NMOS region. The first region may include a first edge being in contact with the second region and a second edge opposite to the first edge, and the fourth region may be in contact with the second edge of the first region.

The standard cell may further include a fifth region having a quadrilateral shape and overlapping with the first power line and the second power line. The second region may include a first edge being in contact with the first region and a second edge opposite to the first edge, and the fifth region may be in contact with the second edge of the second region.

BRIEF DESCRIPTION OF THE DRAWINGS

The above and/or other aspects will become more apparent by describing certain exemplary embodiments with reference to the accompanying drawings, in which:

FIG. 19 is a plan view illustrating a layout of a semiconductor device according to an exemplary embodiment.

DETAILED DESCRIPTION

Figure 1:
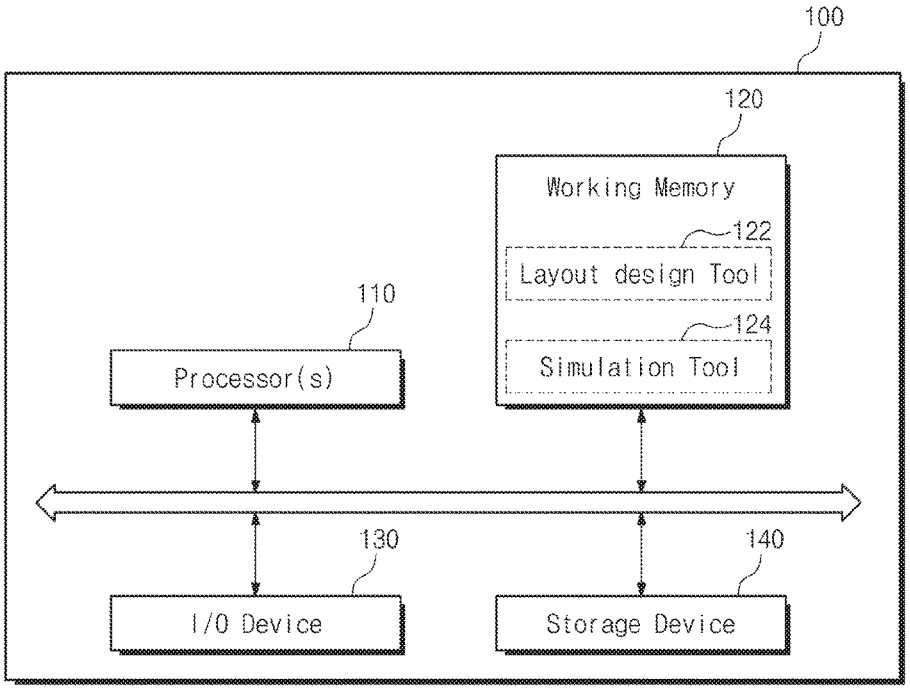
FIG. 1 is a schematic block diagram illustrating a computer system for designing a semiconductor device, according to an exemplary embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

It will be understood that when an element is referred to as being "connected", "coupled", or "adjacent" to another element, it may be directly connected or coupled to the other element or intervening elements may be present. As used herein, the term "and/or" includes any and all combinations of one or more of the associated listed items.

It will be also understood that although the terms "first", "second", "third" etc. may be used herein to describe various elements, these elements should not be limited by these terms. These terms are only used to distinguish one element from another element. Thus, a first element in some embodiments could be termed a second element in other embodiments.

It will be understood that when an element such as a layer, region or substrate is referred to as being "beneath," "below," "above," "on," or "under" another element, it can be directly "beneath," "below," "above," "on," or "under" the other element or intervening elements may be present. In contrast, the term "directly" means that there are no intervening elements. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the invention. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

FIG. 1 is a schematic block diagram illustrating a computer system for designing a semiconductor device, according to an exemplary embodiment. Referring to FIG. 1, a computer system 100 may include one or more processors 110, a working memory 120, an input/output (I/O) device 130, and a storage device 140. In an exemplary embodiment, the computer system 100 may be provided as a dedicated device for designing a layout according to an exemplary embodiment. Moreover, the computer system 100 may be configured to drive various design and verification simulation programs.

The processor 110 may execute software (e.g., application programs, operating system (OS), device drivers) in the computer system 100. The processor 110 may execute an operating system (not shown) loaded in the working memory 120. The processor 110 may execute various application programs to be driven based on the operating system. For example, the processor 110 may execute a layout design tool 122 loaded in the working memory 120.

The operating system or application programs may be loaded in the working memory 120. When the computer system 100 is booted up, an OS image (not shown) stored in the storage device 140 may be loaded to the working memory 120 according to a booting sequence. Overall input/output operations of the computer system 100 may be supported by the operating system. Likewise, application programs which are selected by a user or to provide a basic service may be loaded to the working memory 120. In an exemplary embodiment, the layout design tool 122 prepared for a layout design process according to some embodiments may also be loaded from the storage device 140 to the working memory 120.

The layout design tool 122 may include a biasing function for changing shapes and positions of specific layout patterns, which are defined by a design rule. In addition, the layout design tool 122 may perform a design rule check (DRC) in the changed biasing data condition. The working memory 120 may include a volatile memory device such as a static random access memory (SRAM) device or a dynamic random access memory (DRAM) device. However, exemplary embodiments are not limited thereto. In an exemplary embodiment, the working memory 120 may include a non-volatile memory device such as a phase-change random access memory (PRAM) device, a magnetic random access memory (MRAM) device, a resistance random access memory (ReRAM) device, a ferroelectric random access memory (FRAM) device, and/or a flash memory device.

A simulation tool 124 for performing an optical proximity correction (OPC) on designed layout data may be further loaded to the working memory 120.

The I/O device 130 may include various devices for receiving information from a designer and/or providing information to a designer. For example, the I/O device 130 may include a keyboard, a mouse, and/or a monitor. In an exemplary embodiment, a processing procedure and a processing result of the simulation tool 124 may be shown through the I/O device 130.

The storage device 140 may be a storage medium of the computer system 100. The storage device 140 may store the application programs, the OS image, and various kinds of data. For example, the storage device 140 may include an SSD, an embedded multimedia card (eMMC), and/or a hard disk drive (HDD). In an exemplary embodiment, the storage device 140 may include a NAND flash memory device. However, exemplary embodiments are not limited thereto. In an exemplary embodiment, the storage device 140 may include at least one of non-volatile memory devices such as a PRAM device, a MRAM device, a ReRAM device, a FRAM device, and a NOR flash memory device.

Figure 2:
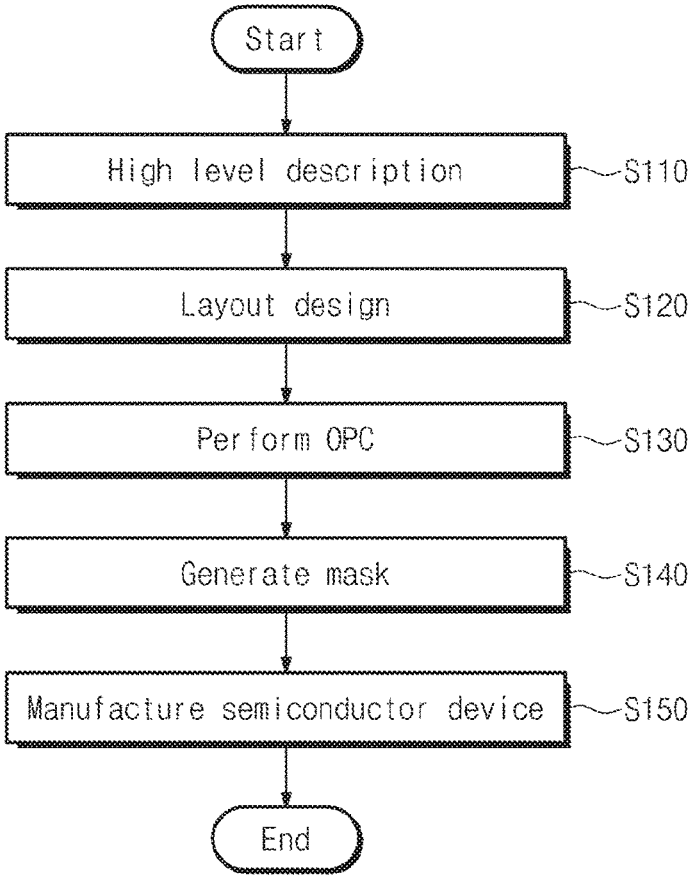
FIG. 2 is a flow chart illustrating a method for designing and manufacturing a semiconductor device, according to an exemplary embodiment.

FIG. 2 is a flow chart illustrating a method for designing and manufacturing a semiconductor device, according to an exemplary embodiment.

In operation S110, a high-level design process of a semiconductor integrated circuit may be performed using the computer system 100 of FIG. 1. The high-level design process may mean that an integrated circuit corresponding to a design target is described with a high-level language of a hardware description language (HDL). For example, the high-level language such as C language may be used in the high-level design process. Circuits designed by the high-level design process may be specifically expressed using a register transfer level (RTL) coding and a simulation. In addition, codes generated by the RTL coding may be converted into a netlist, and the netlist may be synthesized to describe an entire semiconductor device. The synthesized schematic circuit may be verified by the simulation tool 124, and an adjustment process may be performed based on the verified result.

In operation S120, a layout design process may be performed to implement a logically completed semiconductor integrated circuit on a silicon substrate ST. For example, the layout design process may be performed based on the schematic circuit synthesized in the high-level design process or the netlist corresponding to the schematic circuit. The layout design process may include a routing process of placing and connecting various standard cells provided from a cell library, based on a prescribed design rule. The standard cell may mean a logic element (e.g., an inverter or a flip-flop) for performing a specific function. In other words, the standard cell may include a plurality of transistors and at least one interconnection connecting the transistors to each other, which are provided to constitute the logic element.

According to a method for designing a layout in an exemplary embodiment, an unused space in the standard cell may be freed to reduce an area of a layout of a semiconductor device. In a layout design process, a related art standard cell may have a quadrilateral shape. However, to reduce the area of the layout, the standard cell according to an exemplary embodiment may have a polygonal shape, except a quadrilateral shape. That is, the standard cell according to exemplary embodiments does not have a boundary arranged as a quadrilateral shape, although the boundary of the standard cell according to exemplary embodiments is arranged in a polygonal shape. This will be described later in more detail.

A cell library for expressing a specific gate-level circuit as a layout may be defined in the layout design tool. The layout may be prepared to define or describe shapes and sizes of patterns constituting transistors and conductive lines which will be actually formed on a silicon substrate. For example, to actually form an inverter circuit on a silicon substrate, layout patterns (e.g., PMOS, NMOS, N-WELL, gate electrodes, and conductive lines to be disposed thereon) need to be properly placed. For this, suitable one(s) of inverters previously defined in the cell library may be searched and selected. In addition, a routing process may be performed on selected and placed standard cells. These processes may be automatically or manually performed by the layout design tool.

After the routing process, a verification process may be performed on the layout to verify whether there is a portion violating the design rule. In an exemplary embodiment, the verification process may include a DRC for verifying whether the layout meets the design rule, an electrical rule check (ERC) for verifying whether there is an issue of electrical disconnection in the layout, and a layout vs schematic (LVS) for recognizing whether the layout is prepared to coincide with the gate-level netlist.

In operation S130, an optical proximity correction (OPC) process may be performed. The layout patterns obtained by the layout design process may be projected on a silicon substrate by a photolithography process. The OPC process may be a technique for correcting an optical proximity effect occurring in the photolithography process. For example, the OPC process may correct the optical proximity effect which may occur by refraction or diffraction of light and/or a process side effect in an exposure process using the layout patterns. The shapes and positions of the designed layout patterns may be slightly changed by the OPC process.

In operation S140, photomasks may be manufactured based on the layout changed by the OPC process. For example, the photomask may be manufactured by patterning a chromium layer provided on a glass substrate based on the data of the layout patterns.

In operation S150, a semiconductor device may be manufactured using the photomasks. Various exposure processes and various etching processes may be repeatedly performed in the process of manufacturing the semiconductor device, and thus, the patterns defined by the layout design process may be sequentially transferred to a silicon substrate.

Figure 3:
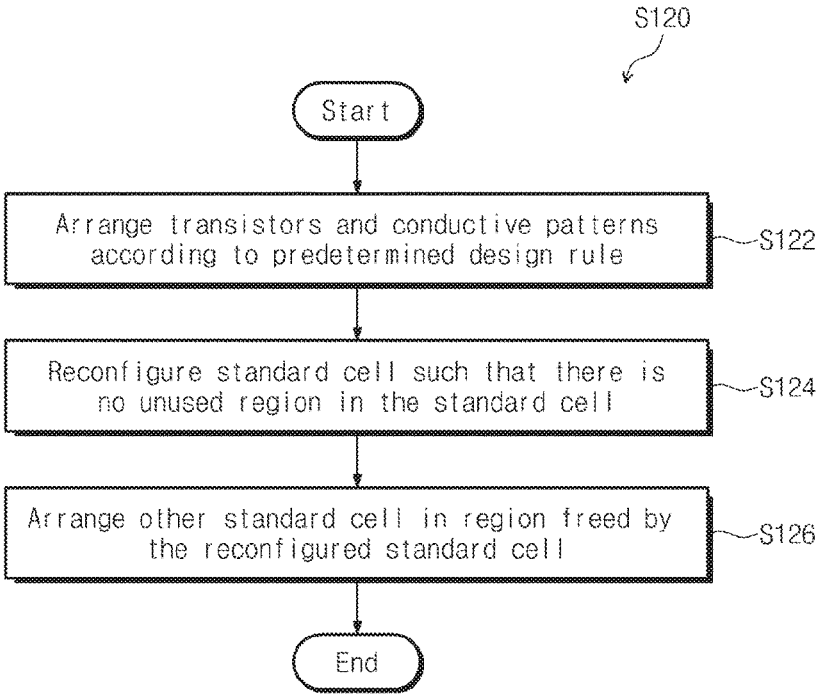
FIG. 3 is a flow chart illustrating an exemplary embodiment of operation S120 illustrated in FIG. 2.
Figure 4:
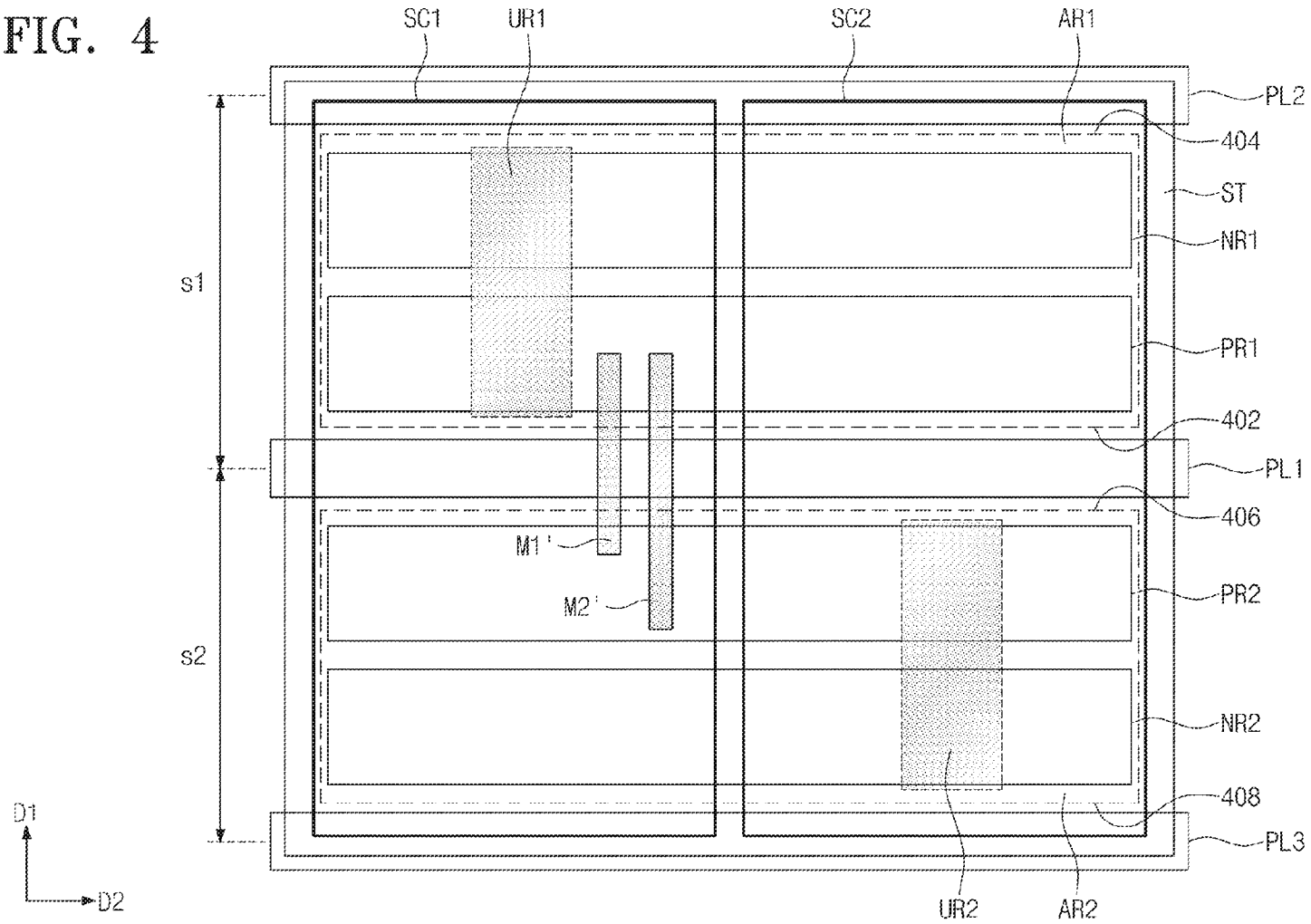
FIGS. 4 and 5 are plan views illustrating layout patterns to explain a method for designing a layout, according to an exemplary embodiment.
Figure 5:
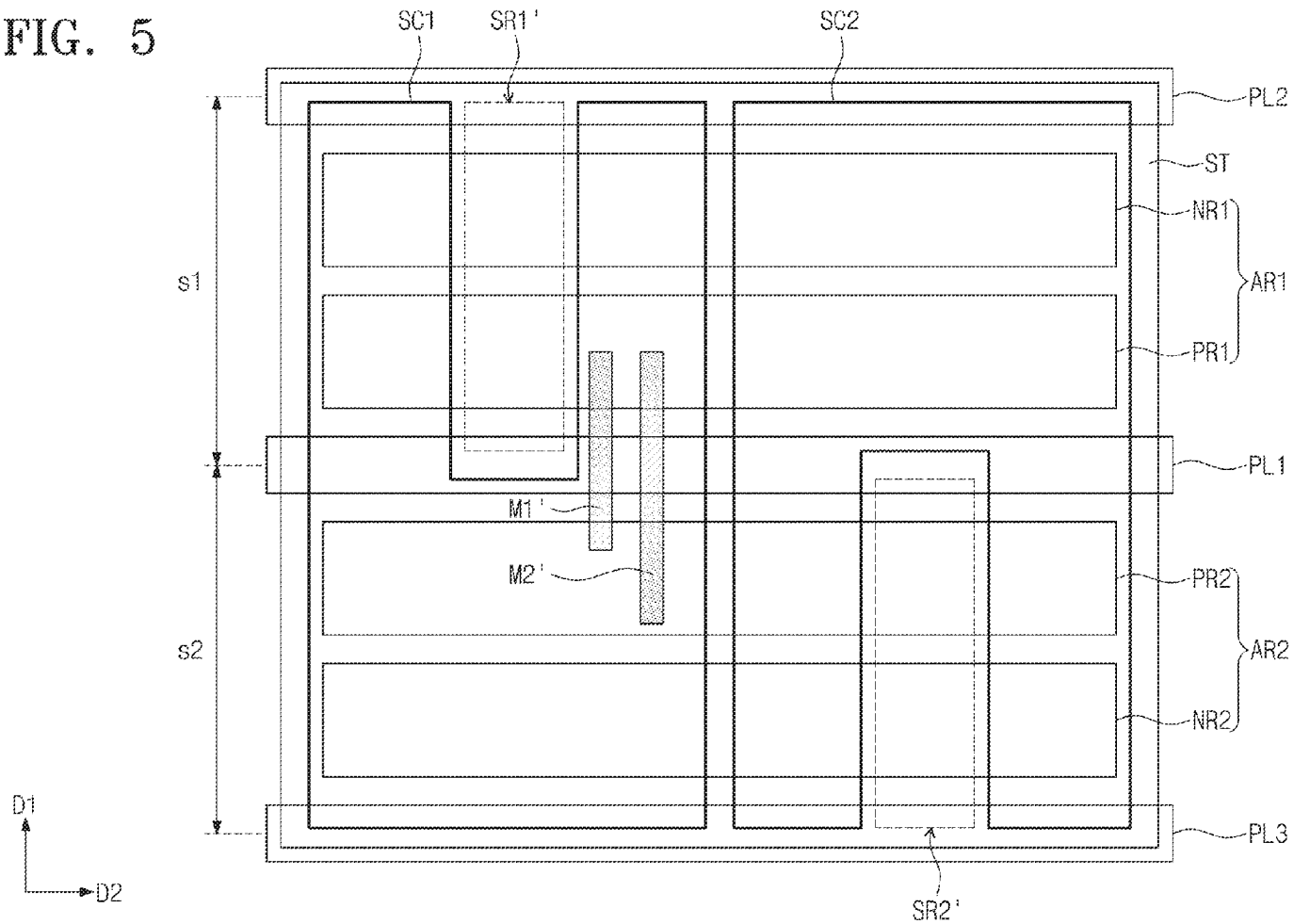

FIG. 3 is a flow chart illustrating an exemplary embodiment of operation S120 illustrated in FIG. 2. FIGS. 4 and 5 are plan views illustrating layout patterns to explain a method for designing a layout, according to an exemplary embodiment.

Hereinafter, in terms used herein, 'a conductive pattern' may mean 'an imaginary conductive line' generated by the layout design tool and 'a conductive line' may mean 'a real conductive line' formed by a photolithography process performed based on the conductive pattern.

Referring to FIGS. 3 and 4, in operation S122, transistors and conductive patterns may be arranged according to a predetermined design rule. Here, the arrangement according to the predetermined design rule may mean that transistors and conductive patterns may be arranged to form a standard cell having a general rectangular shape.

A standard cell SC1 and a standard cell SC2 which have rectangular shapes may be formed based on the predetermined design rule, as illustrated in FIG. 4. Boundaries of the standard cells SC1 and SC2 are illustrated by thick solid lines in FIG. 4. Each of the standard cells SC1 and SC2 may include the first active region AR1 and the second active region AR2 and may include three power lines PL1, PL2, and PL3. A first power line PL1 may be disposed between a first active region AR1 and a second active region AR2 in a plan view and may be adjacent to one edge, i.e., a first edge 402, of the first active region AR1 and one edge, i.e., a first edge 406, of the second active region AR2. The first power line PL1 may extend in a second direction D2. A second power line PL2 may extend in the second direction D2 and may be adjacent to another edge, i.e., a second edge 404, of the first active region AR1, as illustrated in FIG. 4. The third power line PL3 may extend in the second direction D2 and may be adjacent to another edge, i.e., a second edge 408, of the second active region AR2, as illustrated in FIG. 4. For example, the first active region AR1 may be disposed between the first power line PL1 and the second power line PL2 when viewed from a plan view, and the second active region AR2 may be disposed between the first power line PL1 and the third power line PL3 when viewed from a plan view. A distance between the first and second power lines PL1 and PL2 may be defined as a distance s1, and a distance between the first and third power lines PL1 and PL3 may be defined as a distance s2. The distance s1 may be equal to or different from the distance s2.

The first active region AR1 may include a first NMOS region NR1 and a first PMOS region PR1, and the second active region AR2 may include a second NMOS region NR2 and a second PMOS region PR2. Some of the conductive patterns M1' and M2' of the standard cell SC1 are illustrated in FIG. 4. The transistors (not shown) of the standard cell SC1 may be disposed on the active regions AR1 and AR2 adjacent to the conductive patterns M1' and M2'.

If standard cells are arranged based on a related art design rule, unused regions UR1 and UR2 may exist in the standard cells SC1 and SC2. Here, the unused regions UR1 and UR2 may mean regions in which a transistor is not disposed. The unused regions UR1 and UR2 of the standard cells SC1 and SC2 may be disposed at other various positions, unlike illustrated in FIG. 4, based on a layout design.

Referring to FIGS. 3 and 5, in operation S124, the standard cells may be reconfigured such that the unused region is eliminated in the standard cells. Since the standard cells SC1 and SC2 are reconfigured to have polygonal shapes, occupied areas of the standard cells SC1 and SC2 may be reduced. In some embodiments, the layout of the transistors and the conductive patterns of the standard cells SC1 and SC2 are not changed as illustrated in FIG. 5. In some exemplary embodiments, the arrangement of the transistors of the standard cells SC1 and SC2 is not changed, but the arrangement of the conductive patterns of the standard cells SC1 and SC2 may be changed by layouts of other standard cells to be arranged in regions SR1' and SR2' which are freed by reconfiguring standard cells SC1 and SC2.

Referring to FIGS. 3 and 5, in operation S126, other standard cells may be arranged in the freed regions SR1' and SR2'. For example, since each of the freed regions SR1' and SR2' includes two power lines and one NMOS region and one PMOS region, a simple circuit (e.g., an inverter manufactured based on a CMOS technique) may be disposed in each of the freed regions SR1' and SR2'.

Figure 6:
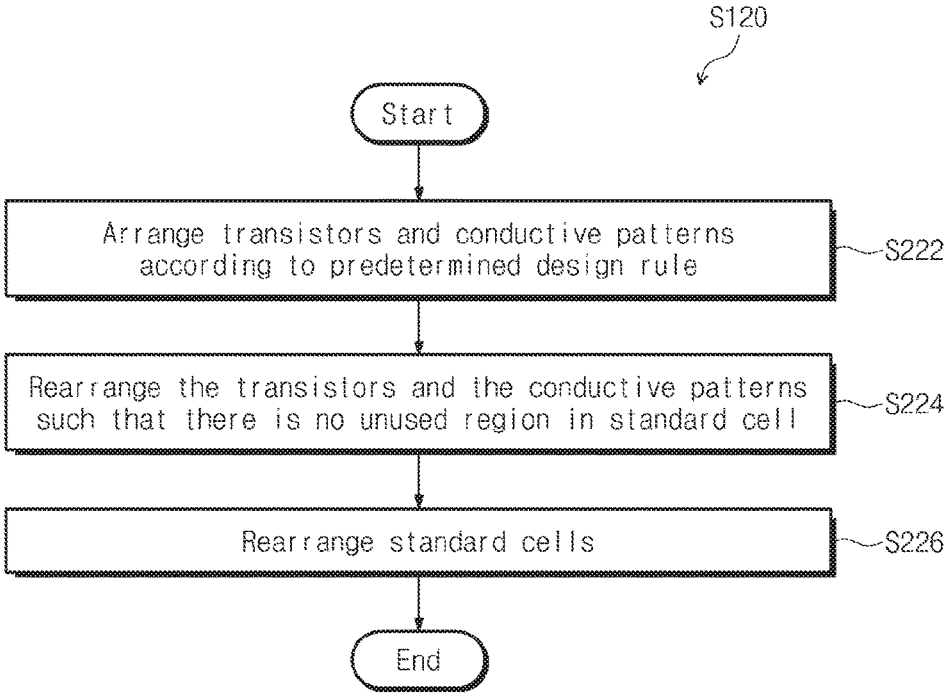
FIG. 6 is a flow chart illustrating an exemplary embodiment of operation S120 illustrated in FIG. 2.
Figure 7:
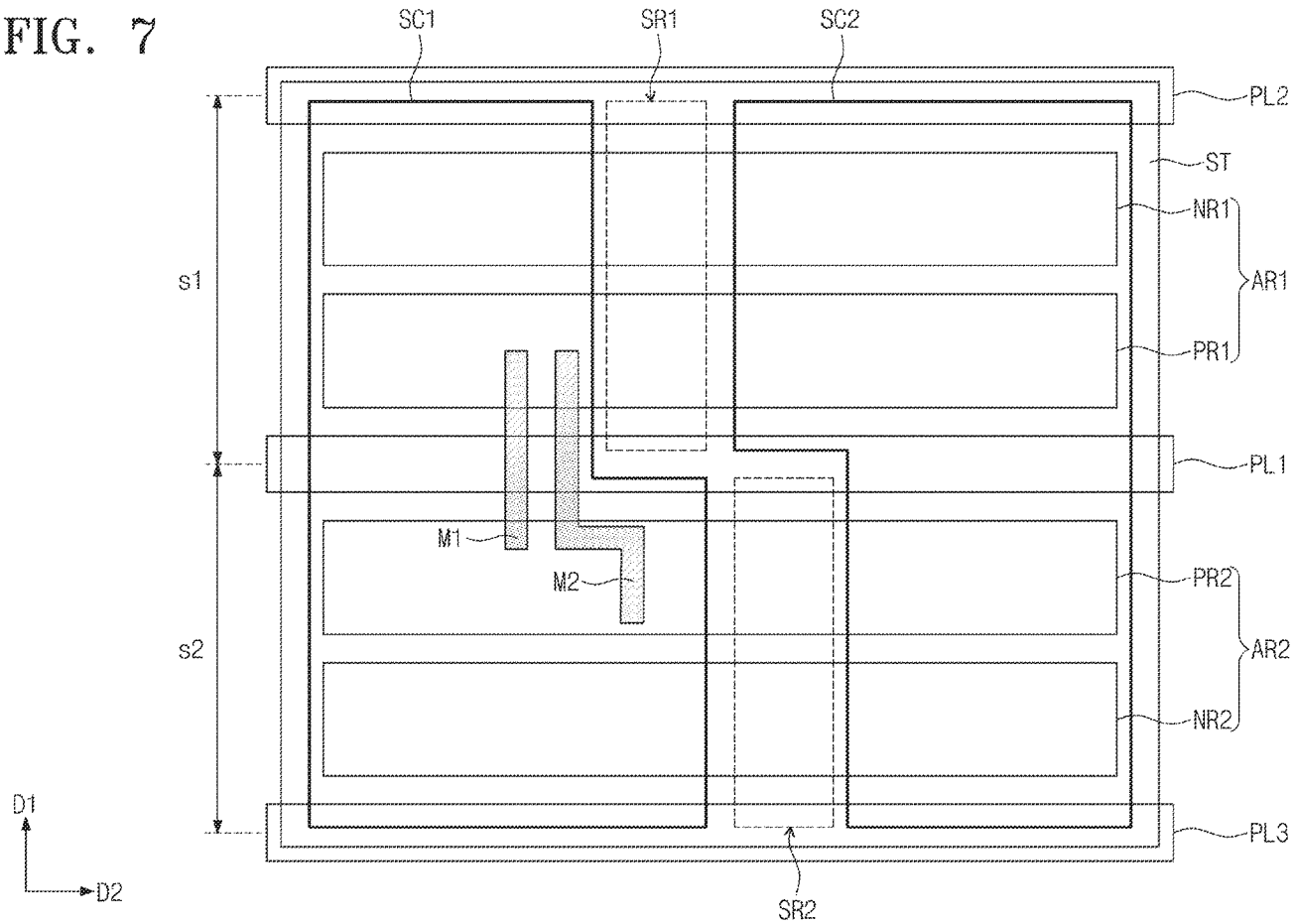
FIGS. 7, 8, and 9 are plan views illustrating layout patterns to explain a method for designing a layout, according to an exemplary embodiment.
Figure 8:
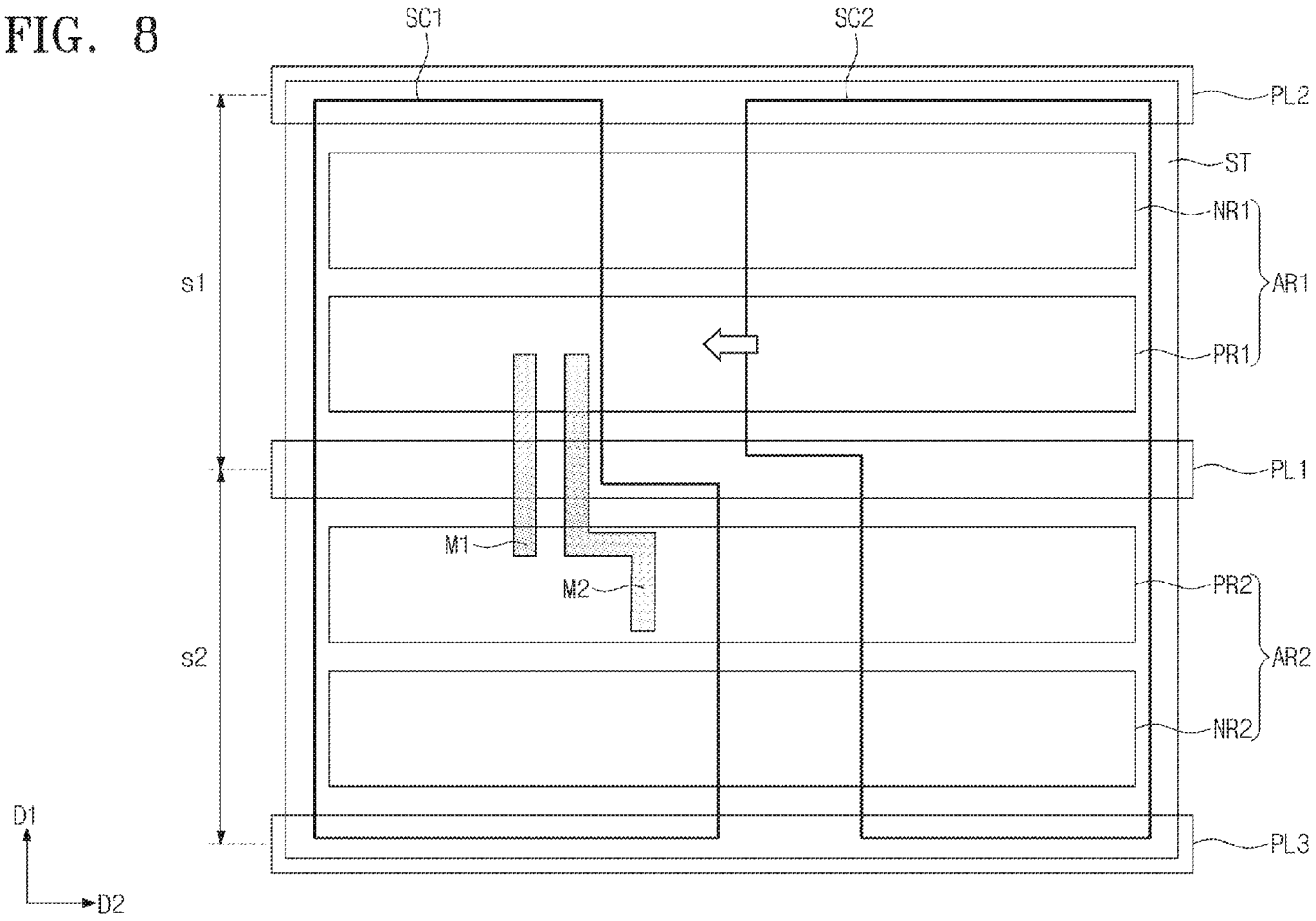
Figure 9:
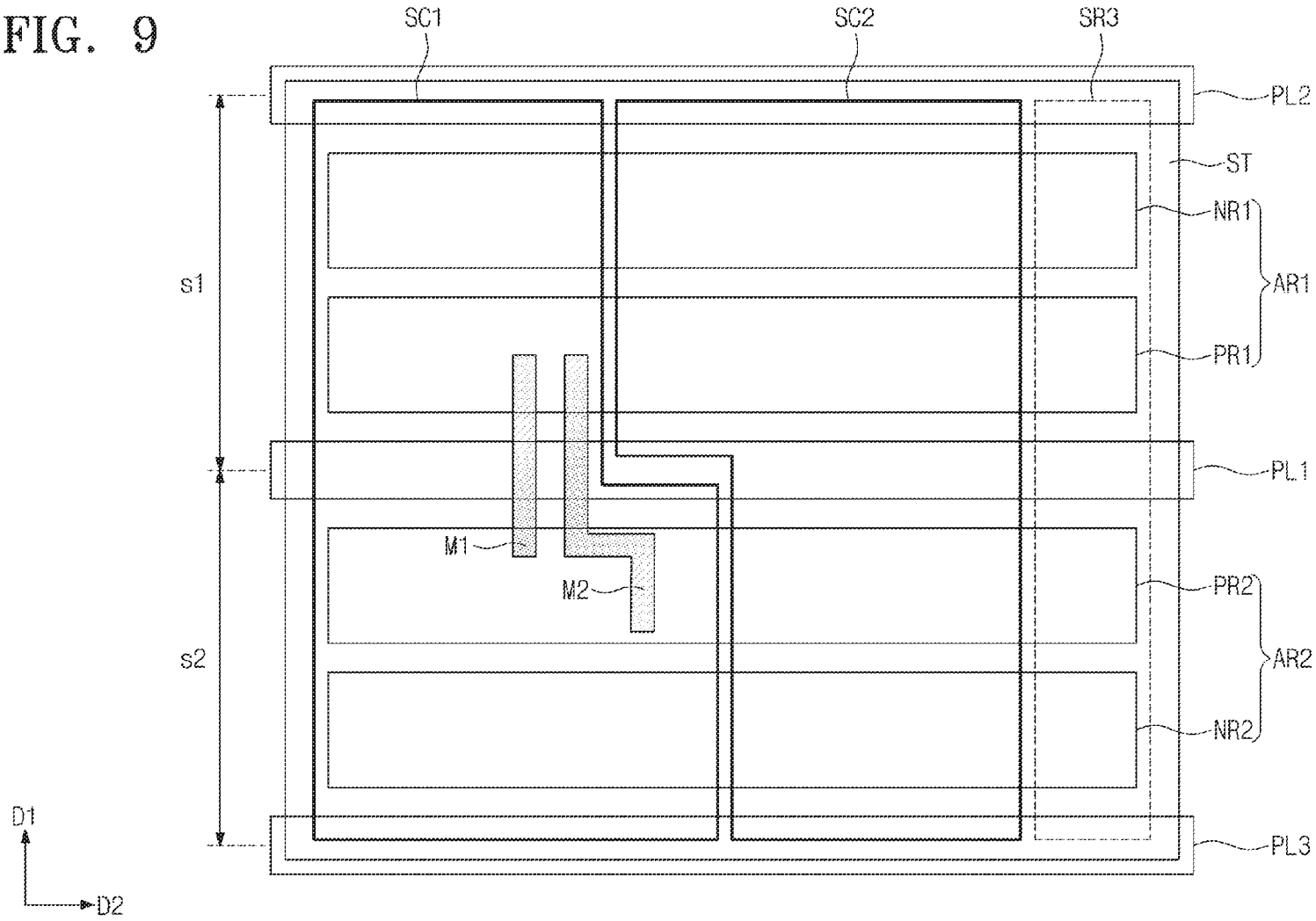

FIG. 6 is a flow chart illustrating an exemplary embodiment of operation S120 illustrated in FIG. 2. FIGS. 7 to 9 are plan views illustrating layout patterns to explain a method for designing a layout, according to an exemplary embodiment.

Operation S222 of FIG. 6 may be the substantially same as operation S122 of FIG. 4, so the description to operation S222 will be omitted.

Referring to FIGS. 6 and 7, in operation S224, transistors and conductive patterns of the standard cells SC1 and SC2 may be rearranged such that there is no unused region in the standard cells SC1 and SC2. For example, the transistors and the conductive patterns of the standard cells SC1 and SC2 may be rearranged in such a way that the freed regions SR1' and SR2' illustrated in FIG. 5 are moved to positions of freed regions SR1 and SR2 illustrated in FIG. 7. The rearranged conductive patterns M1 and M2 are illustrated in FIG. 7. In an exemplary embodiment, the transistors adjacent to the conductive patterns M1 and M2 may also be rearranged by the rearrangement of the conductive patterns M1 and M2.

Referring to FIGS. 6, 8, and 9, the standard cells SC1 and SC2 may be rearranged in operation S226. In FIGS. 8 and 9, the standard cell SC1 may include a first portion including the first active region AR1 and a second portion including the second active region AR2, and the standard cell SC2 may include a first portion including the first active region AR1 and a second portion including the second active region AR2. Here, a width in the second direction D2 of the first portion of the standard cell SC1 may be smaller than a width in the second direction D2 of the second portion of the standard cell SC1, but a width in the second direction D2 of the first portion of the standard cell SC2 may be greater than a width in the second direction D2 of the second portion of the standard cell SC2. The standard cells SC1 and SC2 may be rearranged similarly to putting together a puzzle.

Since the standard cells SC1 and SC2 are rearranged similarly to putting together the puzzle in FIGS. 8 and 9, a region SR3 may be freed. The freed region SR3 may overlap with the first power line PL1, the first active region AR1, the second power line PL2, the second active region AR2, and the third power line PL3, and thus, the freed region SR3 may be used to design a standard cell of which a size is greater than the size of a standard cell that may be disposed in the freed regions SR1 and SR2 illustrated in FIG. 7.

FIGS. 10 to 14 are plan views illustrating standard cells according to an exemplary embodiment. Standard cells illustrated in FIGS. 10 to 14 may overlap with (i.e., at least partially include) at least two active regions. For example, the standard cells SC1 illustrated in FIGS. 10 to 13 may overlap with (i.e., at least partially include) first and second active regions AR1 and AR2. The standard cell SC1 illustrated in FIG. 14 may overlap with (i.e., at least partially include) first, second and third active regions AR1, AR2, and AR3. The standard cell extending over at least two active regions may be defined as a multi-height cell.

Figure 10:
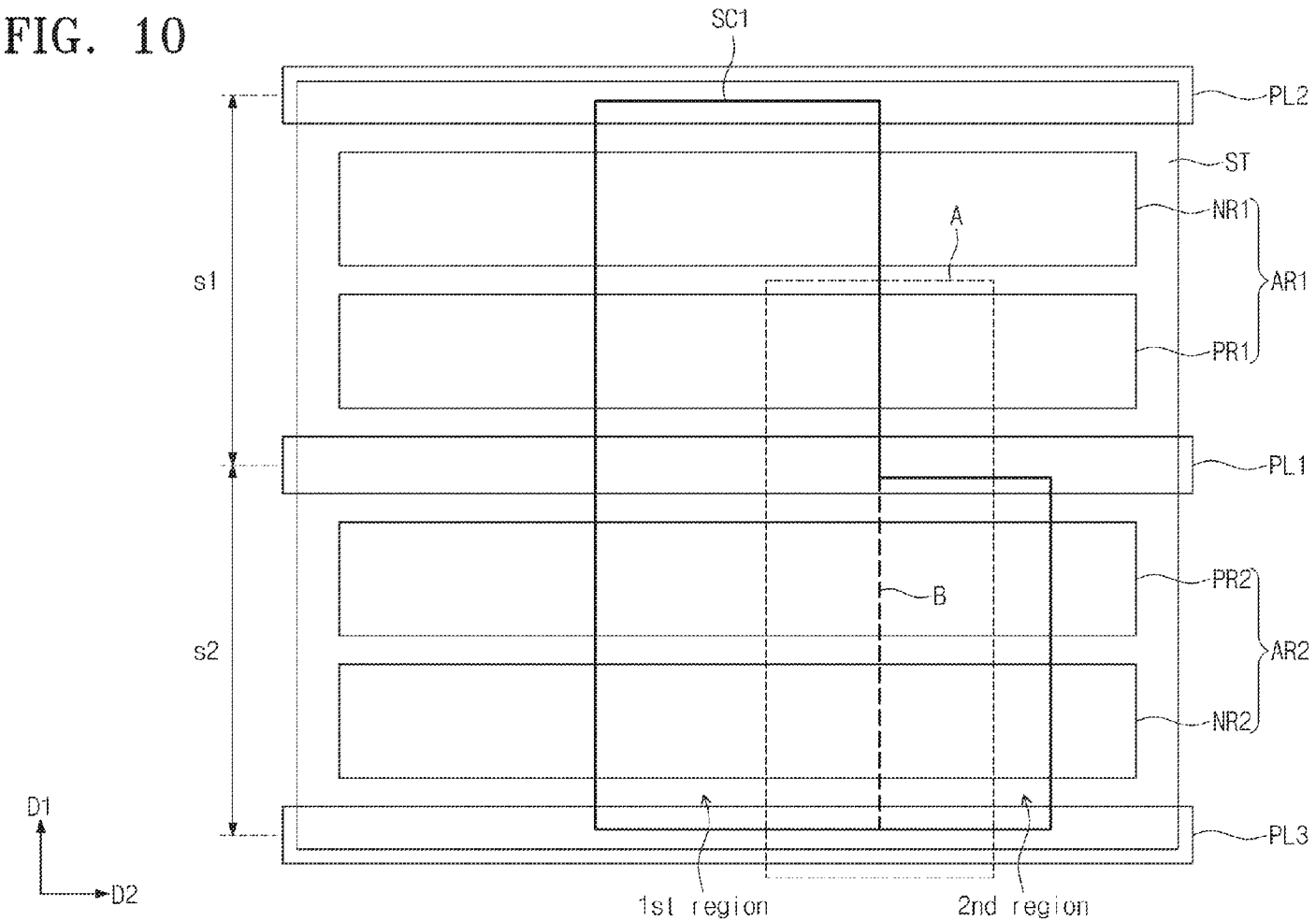
FIGS. 10, 11, 12, 13, and 14 are plan views illustrating standard cells according to an exemplary embodiment.

FIG. 10 illustrates an exemplary embodiment of the standard cell SC1 having a polygonal shape. A boundary of the standard cell SC1 is illustrated by a thick solid line. For example, the standard cell SC1 may include a first region and a second region. A sub-boundary between the first region and the second region is illustrated by a thick dotted line B. I.e., the sub-boundary B is shared by the first region and the second region and serves as a division line between an area of the first region and an area of the second region. The standard cell SC1 divided into the first and second regions along a first direction D1 is illustrated only as an example in FIG. 10. However, in an exemplary embodiment, the standard cell SC1 may be divided along the second power line PL2. The first and second regions are not divided from each other based on their logical functions but are divided from each other so that the standard cell SC1 has the polygonal shape, but does not have the quadrilateral shape of the related art, although the individual regions included in the standard cell may have a quadrilateral shape. In FIG. 10, a region 'A' illustrated by a thin dotted line is used to describe a portion of a semiconductor device in more detail with reference to FIGS. 20A to 20E. This may be identically applied to the exemplary embodiments of FIGS. 11 to 18.

The first region may overlap with (i.e., at least partially include) the second power line PL2, the first active region AR1, the first power line PL1, the second active region AR2, and the third power line PL3. The first active region AR1 may include the first NMOS region NR1 and the first PMOS region PR1, and the second active region AR2 may include the second NMOS region and the second PMOS region PR2. The second region may overlap with (i.e., at least partially include) the first power line PL1, the second active region AR2, and the third power line PL3.

A basic logic element (e.g., a multi-bit flip-flop) performing a specific function may be formed using the transistors on the active regions AR1 and AR2 of the standard cell SC1.

Figure 11:
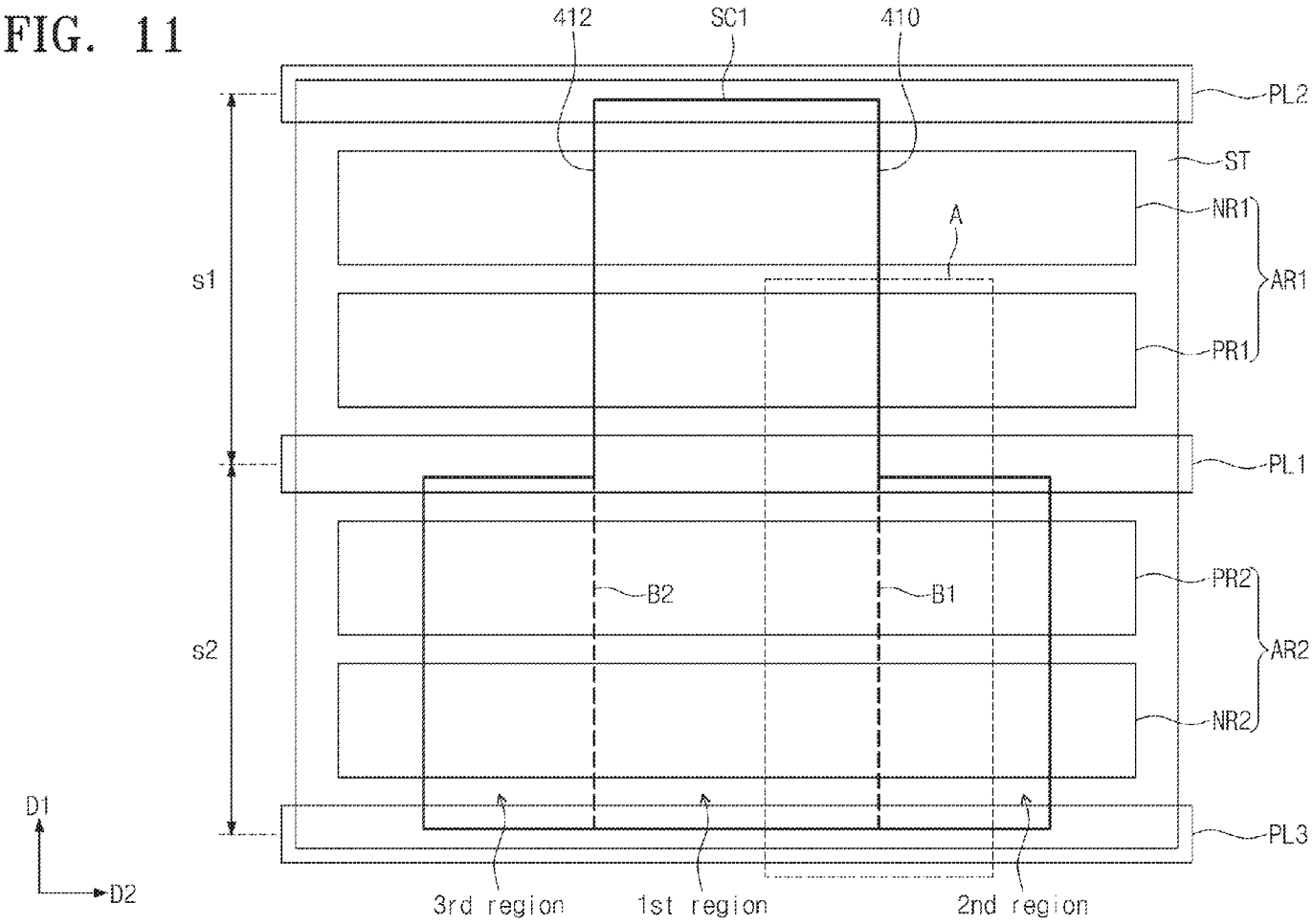

FIG. 11 illustrates an exemplary embodiment of the standard cell SC1 having a polygonal shape. For example, the standard cell SC1 may include a first region, a second region, and a third region. A thick dotted line B1 may be a boundary between the first region and the second region, and a thick dotted line B2 may be a boundary between the first region and the third region.

The first region may overlap with (i.e., at least partially include) the second power line PL2, the first active region AR1, the first power line PL1, the second active region AR2, and the third power line PL3. Each of the second and third regions may overlap with (i.e., at least partially include) the first power line PL1, the second active region AR2, and the third power line PL3. The second region may be in contact with one edge of the first region, and the third region may be in contact with another edge, opposite to the one edge, of the first region.

Figure 12:
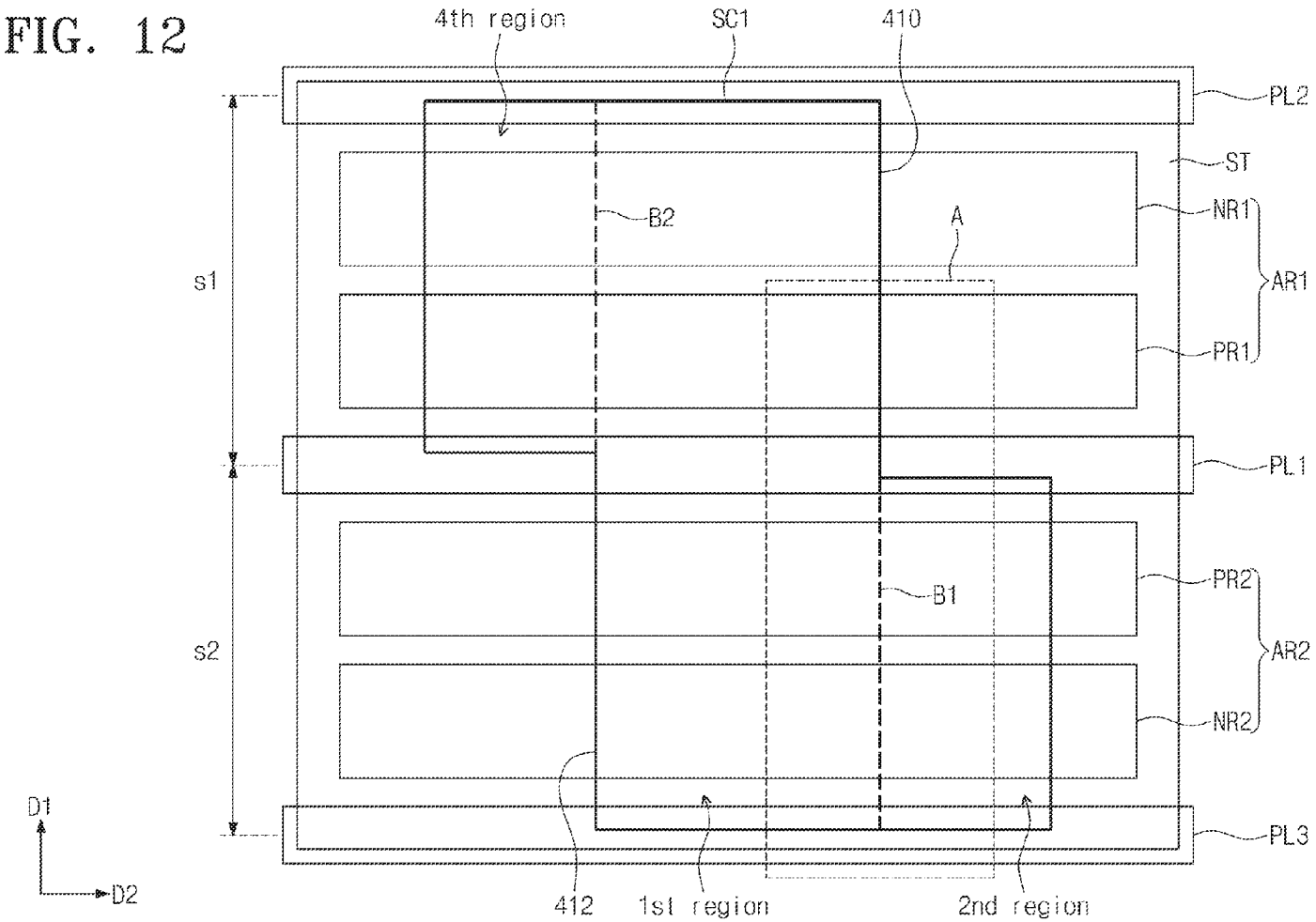

FIG. 12 illustrates an exemplary embodiment of the standard cell SC1 having a polygonal shape. For example, the standard cell SC1 may include a first region, a second region, and a fourth region. A thick dotted line B1 may be a boundary between the first region and the second region, a thick dotted line B2 may be a boundary between the first region and the fourth region.

The first region may overlap with (i.e., at least partially include) the second power line PL2, the first active region AR1, the first power line PL1, the second active region AR2, and the third power line PL3. The second region may overlap with (i.e., at least partially include) the first power line PL1, the second active region AR2, and the third power line PL3. The fourth region may overlap with (i.e., at least partially include) the second power line PL2, the first active region AR1, and the first power line PL1. The second region may be in contact with one edge of the first region, and the fourth region may be in contact with another edge, opposite to the one edge, of the first region.

Figure 13:
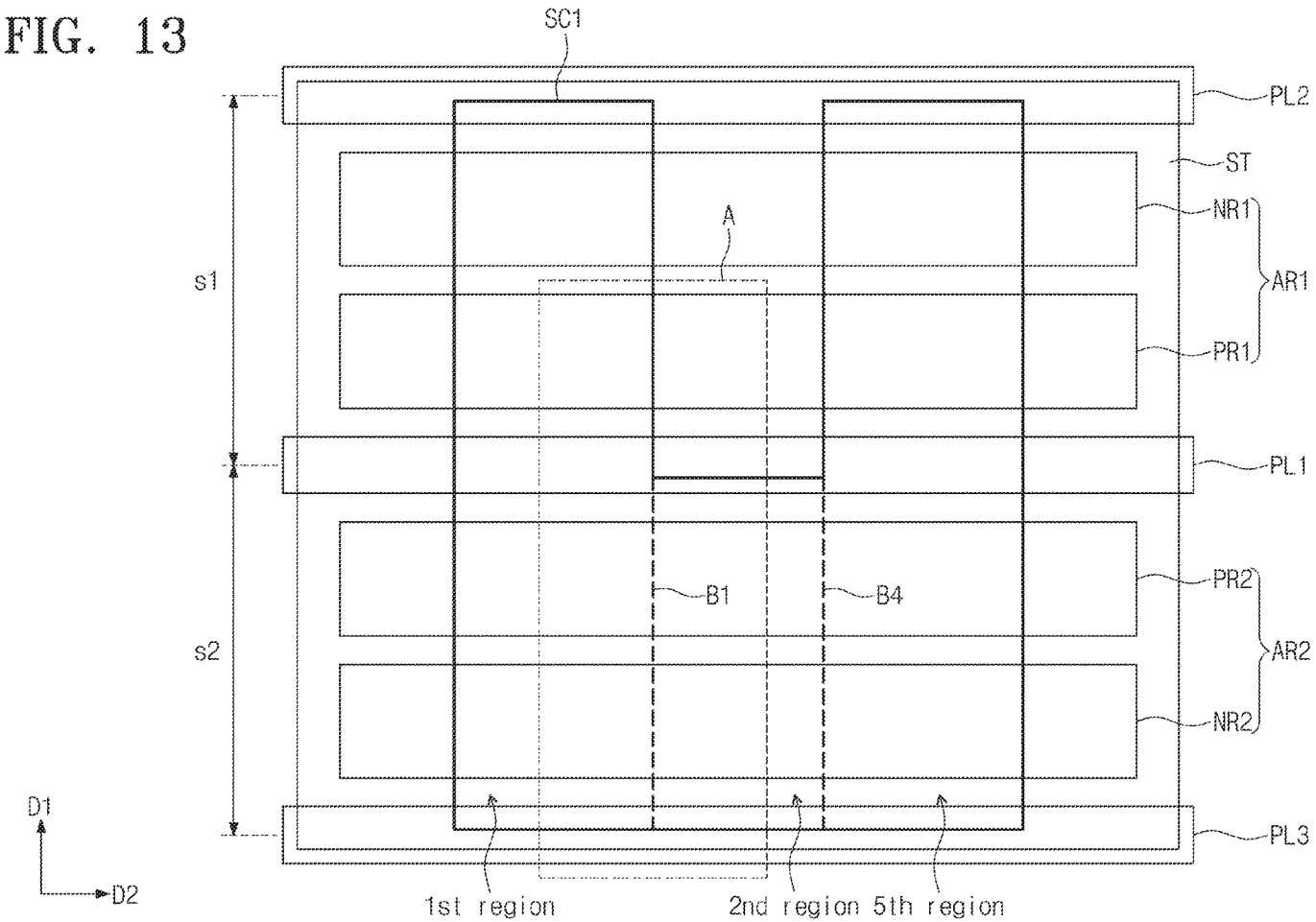

FIG. 13 illustrates an exemplary embodiment of the standard cell SC1 having a polygonal shape. For example, the standard cell SC1 may include a first region, a second region, and a fifth region. A thick dotted line B1 may be a boundary between the first region and the second region, and a thick dotted line B4 may be a boundary between the second region and the fifth region.

The first region may overlap with (i.e., at least partially include) the second power line PL2, the first active region AR1, the first power line PL1, the second active region AR2, and the third power line PL3. The second region may overlap with (i.e., at least partially include) the first power line PL1, the second active region AR2, and the third power line PL3. The fifth region may overlap with (i.e., at least partially include) the second power line PL2, the first active region AR1, the first power line PL1, the second active region AR2, and the third power line PL3. The first region may be in contact with a first edge (illustrated by B1) of the second region, and the fifth region may be in contact with a second edge (illustrated by B4) that is opposite to the first edge, of the second region. In other words, the second region may be disposed between the first region and the fifth region.

Figure 14:
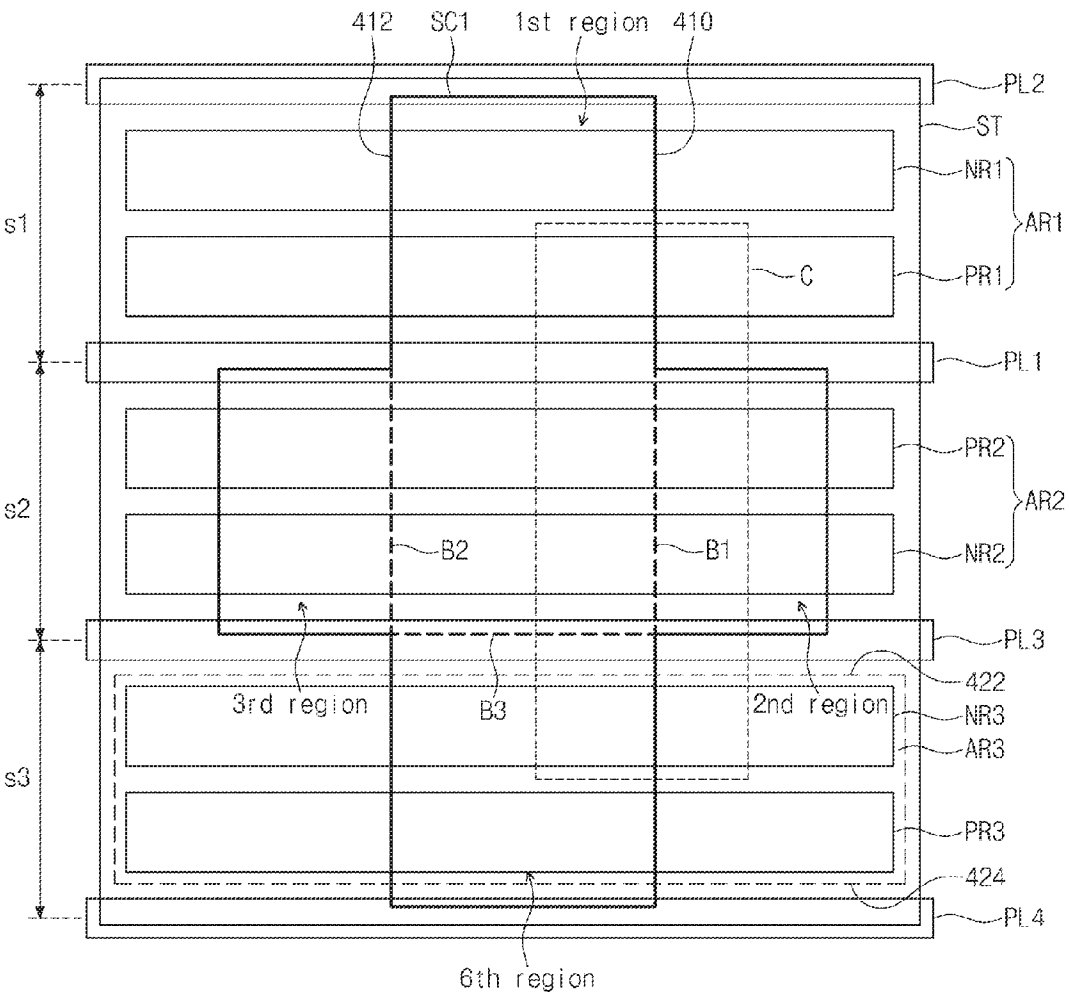

FIG. 14 illustrates an exemplary embodiment of the standard cell SC1 having a polygonal shape. For example, the standard cell SC1 may include a first region, a second region, a third region, and a sixth region. A thick dotted line B1 may be a boundary between the first region and the second region, a thick dotted line B2 may be a boundary between the first region and the third region, and a thick dotted line B3 may be a boundary between the first region and the sixth region.

The first region may overlap with (i.e., at least partially include) the second power line PL2, the first active region AR1, the first power line PL1, the second active region AR2, and the third power line PL3. Each of the second and third regions may overlap with (i.e., at least partially include) the first power line PL1, the second active region AR2, and the third power line PL3. The second region may be in contact with a portion (illustrated by B1) of a first edge 410 of the first region, and the third region may be in contact with a portion (illustrated by B2) of a second edge 412, opposite to the first edge, of the first region.

A third active region AR3 may be disposed at a side of the second active region AR2. The second active region AR2 may be disposed between the first active region AR1 and the third active region AR3. The third active region AR3 may have a first edge 422 adjacent to the third power line PL3 and a second edge 424 opposite to the first edge. A fourth power line PL4 may be adjacent to the second edge 424 of the third active region AR3 and may extend in the second direction D2. The third active region AR3 may include a third NMOS region NR3 and a third PMOS region PR3. The sixth region may overlap with (i.e., at least partially include) the third power line PL3, the third active region AR3, and the fourth power line PL4. The sixth region may be in contact with a third edge of the first region, which is not in contact with the second and third regions.

The standard cells described above may have the polygonal shape and may have at least three power lines and at least two active regions. In addition, each of the active regions may include the NMOS region and the PMOS region. In particular, relatively large-sized standard cells have been demanded with the development of a circuit design technique. However, a layout area of the semiconductor device according to an exemplary embodiment may be reduced by the standard cell having the polygonal shape.

FIGS. 15 to 18 are plan views illustrating standard cells according to an exemplary embodiment. Standard cells of FIGS. 15 to 18 may have a polygonal shape overlapping with (i.e., at least partially including) two power lines and one active region. The standard cell overlapping with (i.e., at least partially including) one active region may be defined as a single-height cell.

Figure 15:
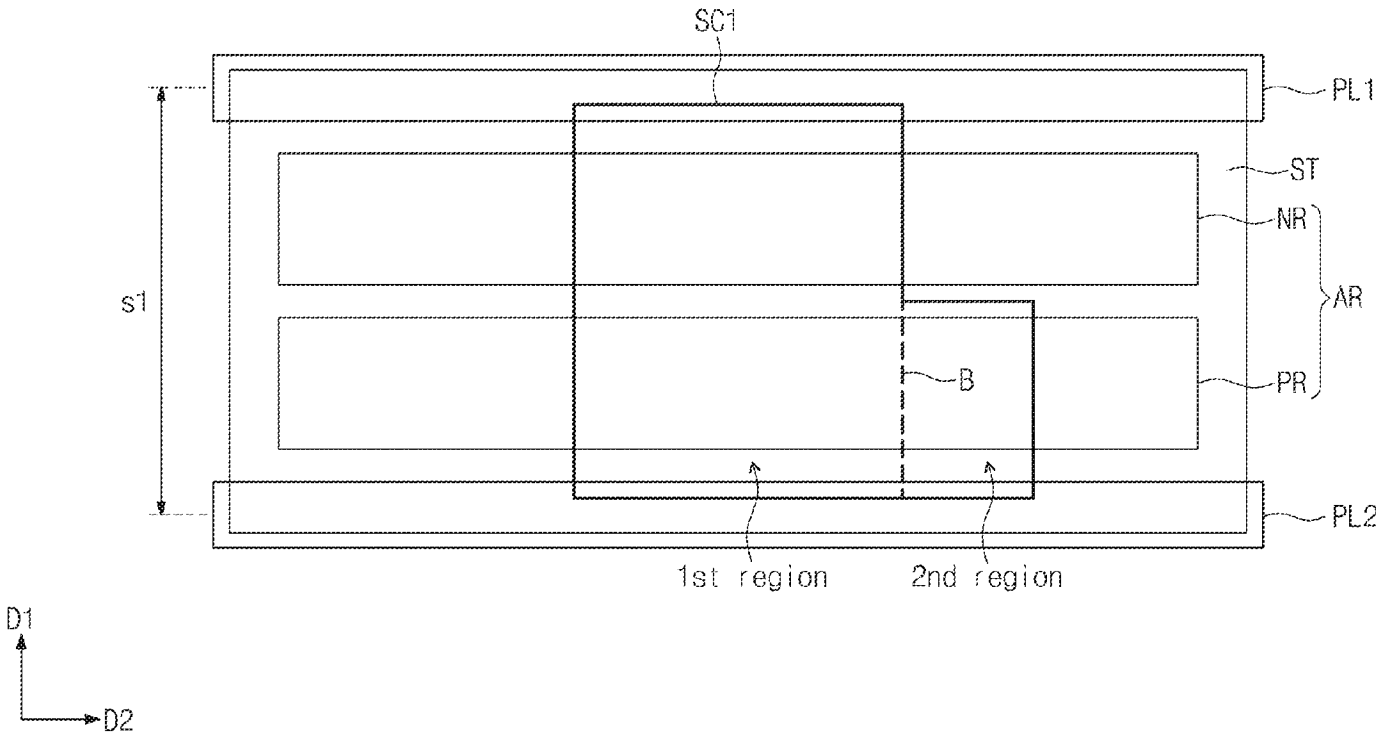
FIGS. 15, 16, 17, and 18 are plan views illustrating standard cells according to an exemplary embodiment.

FIG. 15 illustrates an exemplary embodiment of the standard cell SC1 having the polygonal shape. For example, the standard cell SC1 may include a first region and a second region. A thick dotted line B may be a boundary between the first region and the second region.

The first region may overlap with (i.e., at least partially include) a first power line PL1, an active region AR, and a second power line PL2. The active region AR may include an NMOS region NR and a PMOS region PR. The second region may overlap with (i.e., at least partially include) the PMOS region PR and the second power line PL2. Transistors for performing a specific function may be formed on the NMOS region NR and PMOS region PR of the standard cell SC1. In addition, conductive patterns for connecting the transistors to each other or connecting the transistors to another standard cell may also be disposed on the NMOS region NR and PMOS region PR of the standard cell SC1.

Figure 16:
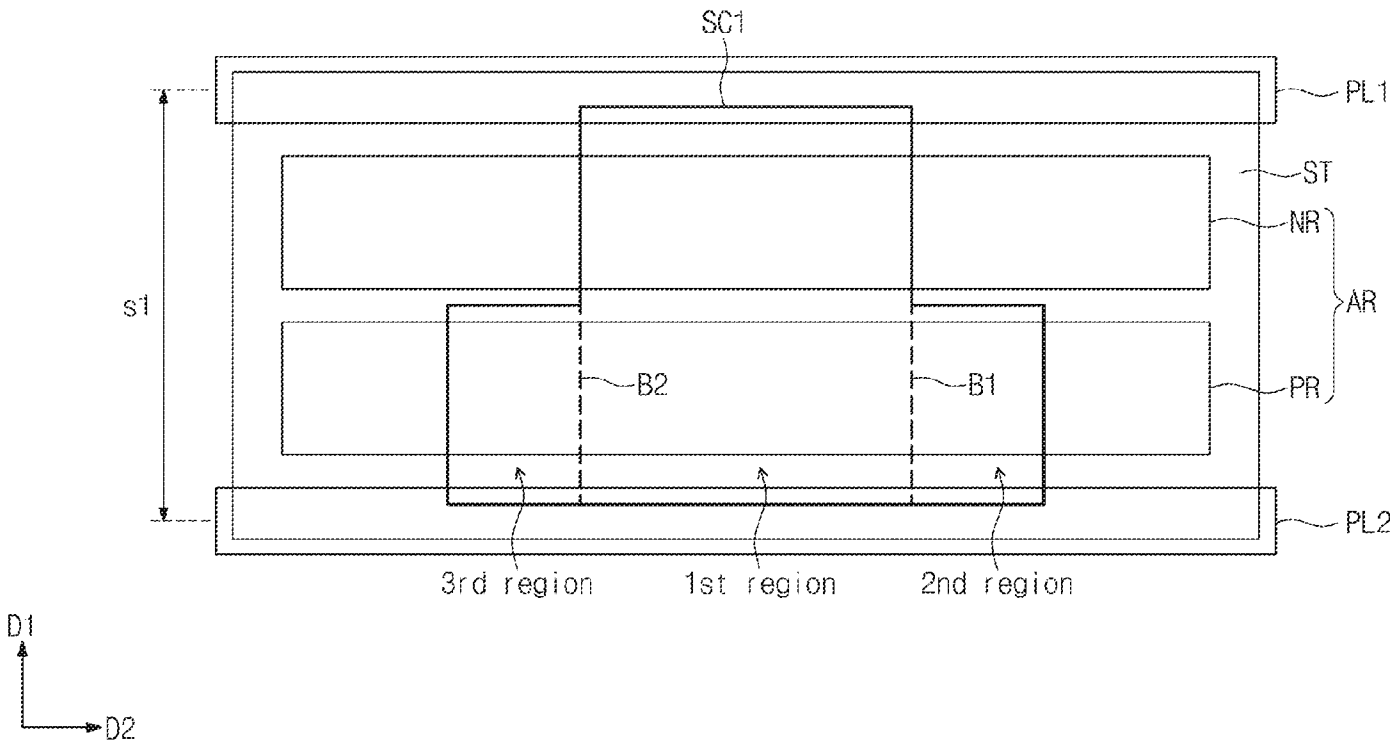

FIG. 16 illustrates an exemplary embodiment of the standard cell SC1 having the polygonal shape. For example, the standard cell SC1 may include a first region, a second region, and a third region. A thick dotted line B1 may be a boundary between the first region and the second region, and a thick dotted line B2 may be a boundary between the first region and the third region.

The first region may overlap with (i.e., at least partially include) the first power line PL1, the active region AR, and the second power line PL2. Each of the second and third regions may overlap with (i.e., at least partially include) the second power line PL2 and the PMOS region PR. The second region may be in contact with one edge of the first region, and the third region may be in contact with another edge, opposite to the one edge, of the first region.

Figure 17:
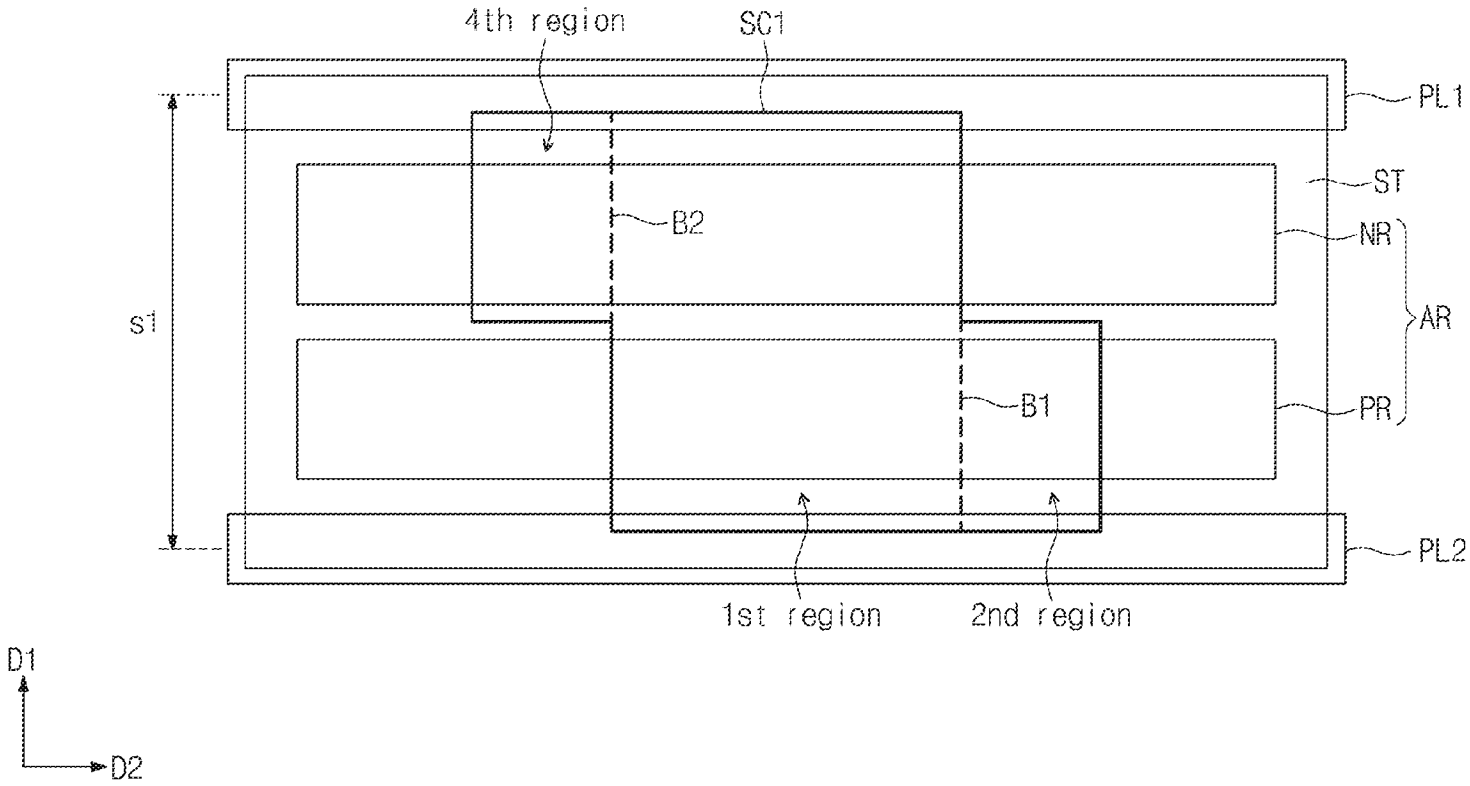

FIG. 17 illustrates an exemplary embodiment of the standard cell SC1 having the polygonal shape. For example, the standard cell SC1 may include a first region, a second region, and a fourth region. A thick dotted line B1 may be a boundary between the first region and the second region, and a thick dotted line B2 may be a boundary between the first region and the fourth region.

The first region may overlap with (i.e., at least partially include) the first power line PL1, the active region AR, and the second power line PL2. The second region may overlap with (i.e., at least partially include) the PMOS region PR and the second power line PL2. The fourth region may overlap with (i.e., at least partially include) the first power line PL1 and the NMOS region NR. The second region may be in contact with one edge of the first region, and the fourth region may be in contact with another edge, opposite to the one edge, of the first region.

Figure 18:
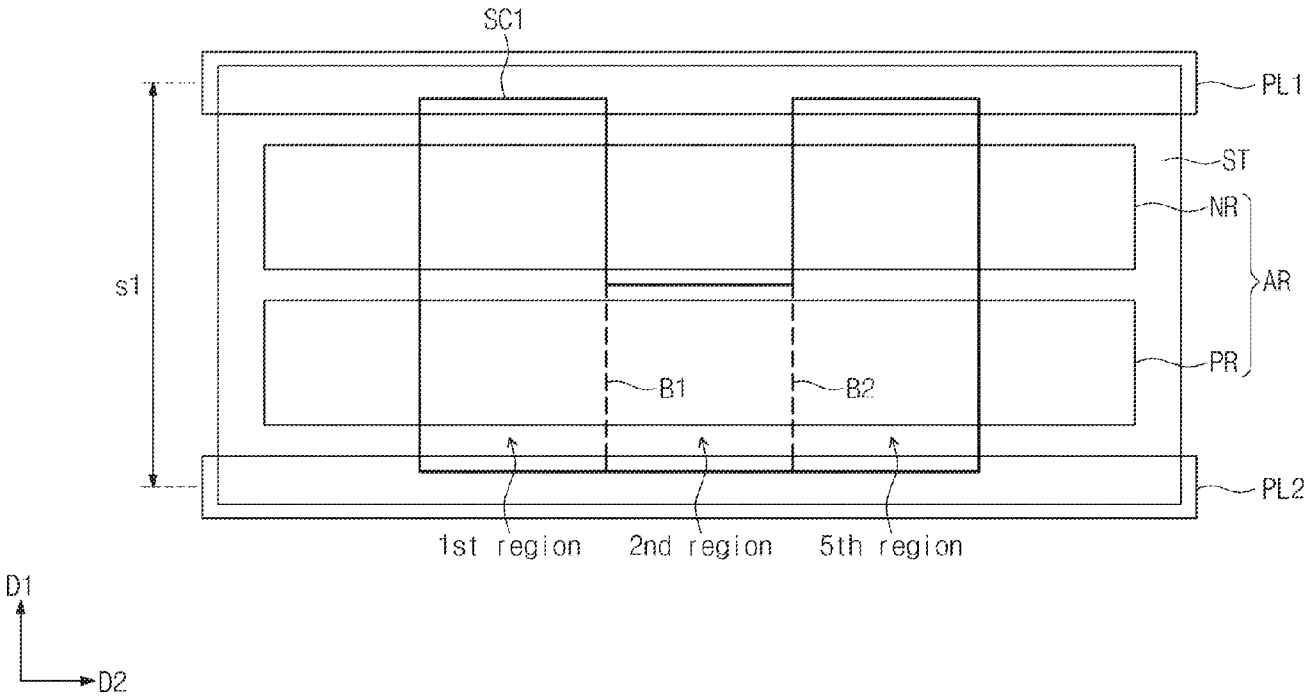

FIG. 18 illustrates an exemplary embodiment of the standard cell SC1 having the polygonal shape. For example, the standard cell SC1 may include a first region, a second region, and a fifth region. A thick dotted line B1 may be a boundary between the first region and the second region, and a thick dotted line B2 may be a boundary between the second region and the fifth region.

Each of the first and fifth regions may overlap with (i.e., at least partially include) the first power line PL1, the active region AR, and the second power line PL2. The second region may overlap with (i.e., at least partially include) the PMOS region PR and the second power line PL2. The second region may be in contact with one edge of the first region, and the fifth region may be in contact with another edge of the second region, which is not in contact with the first region.

FIG. 19 is a plan view illustrating a layout of a semiconductor device according to an exemplary embodiment. FIG. 19 illustrates standard cells SC1 to SC7 designed according to an exemplary embodiment. As illustrated in FIG. 19, the standard cells SC1, SC2, SC4, and SC6 may be multi-height cells, and the standard cells SC3, SC5, and SC7 may be single-height cells. As described above, each of the standard cells SC1 to SC7 may overlap with (i.e., at least partially include) at least one of the active regions AR1 to AR3. In FIG. 19, the standard cell SC2 overlaps with (i.e., at least partially include) three active regions AR1 to AR3. However, exemplary embodiments are not limited thereto. The standard cell may overlap with (i.e., at least partially include) four or more active regions.

Various standard cells having the polygonal shapes which are not a quadrilateral shape are described in the above embodiments. Since the layout of the semiconductor device is designed using the standard cell having the polygonal shape which is not a quadrilateral shape, the occupied area of the layout of the semiconductor device may be reduced.

Figure 20A:
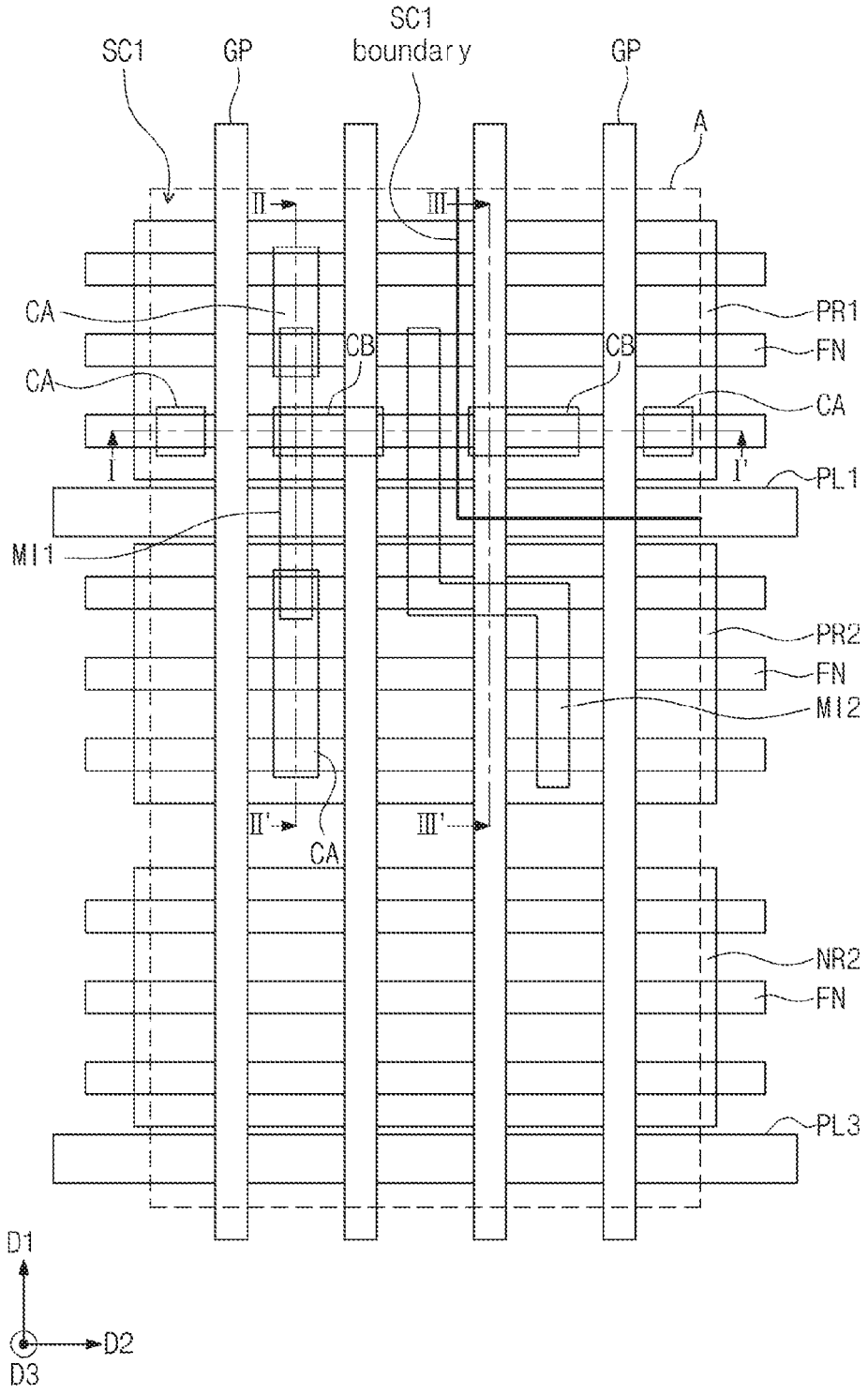
FIGS. 20A and 20B are plan views illustrating semiconductor devices including standard cells having polygonal shapes, according to an exemplary embodiment.
Figure 20B:
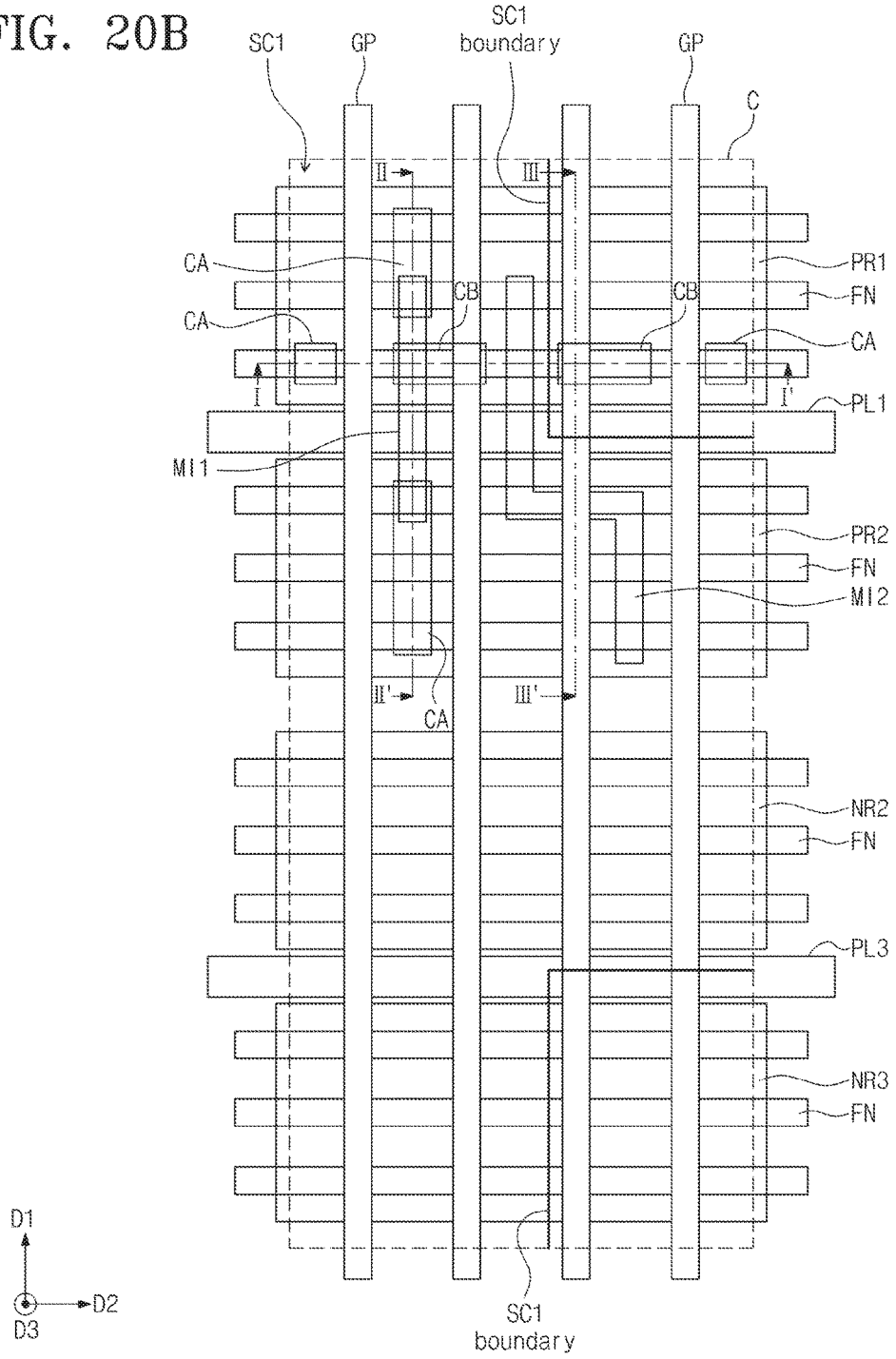
Figure 20C:
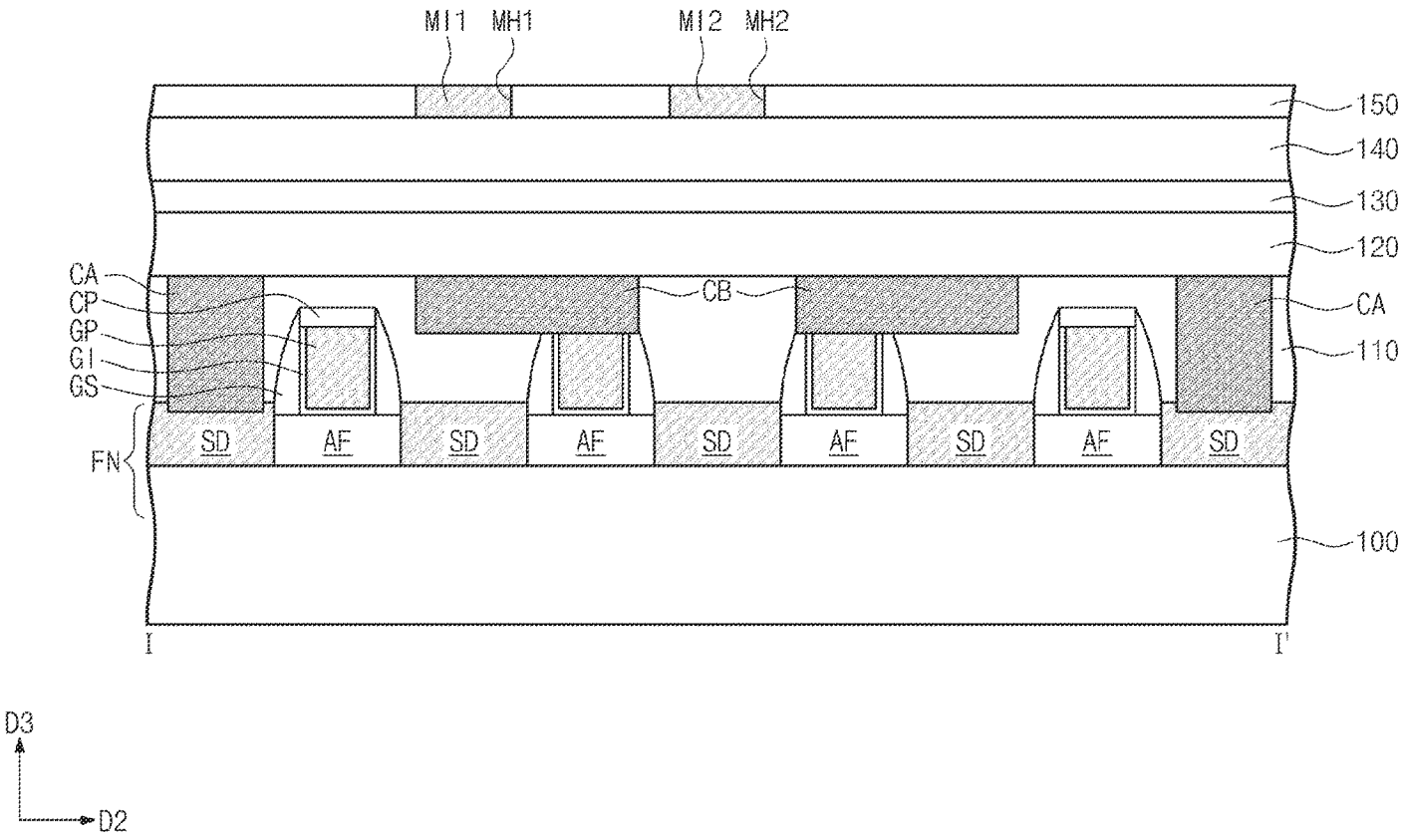
FIG. 20C is a cross-sectional view taken along a line I-I' of FIG. 20A or 20B.
Figure 20D:
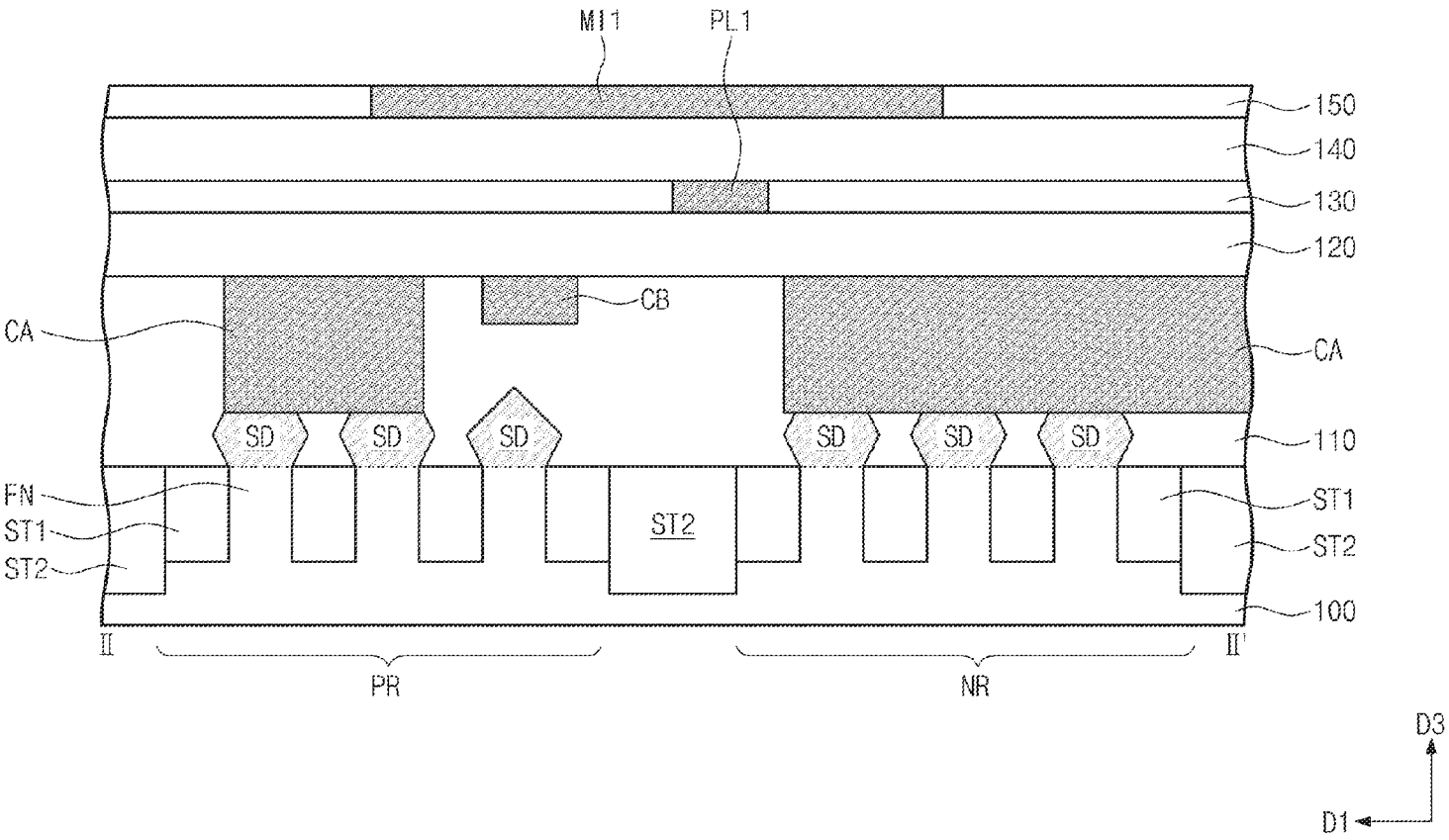
FIG. 20D is a cross-sectional view taken along a line II-II' of FIG. 20A or 20B.
Figure 20E:
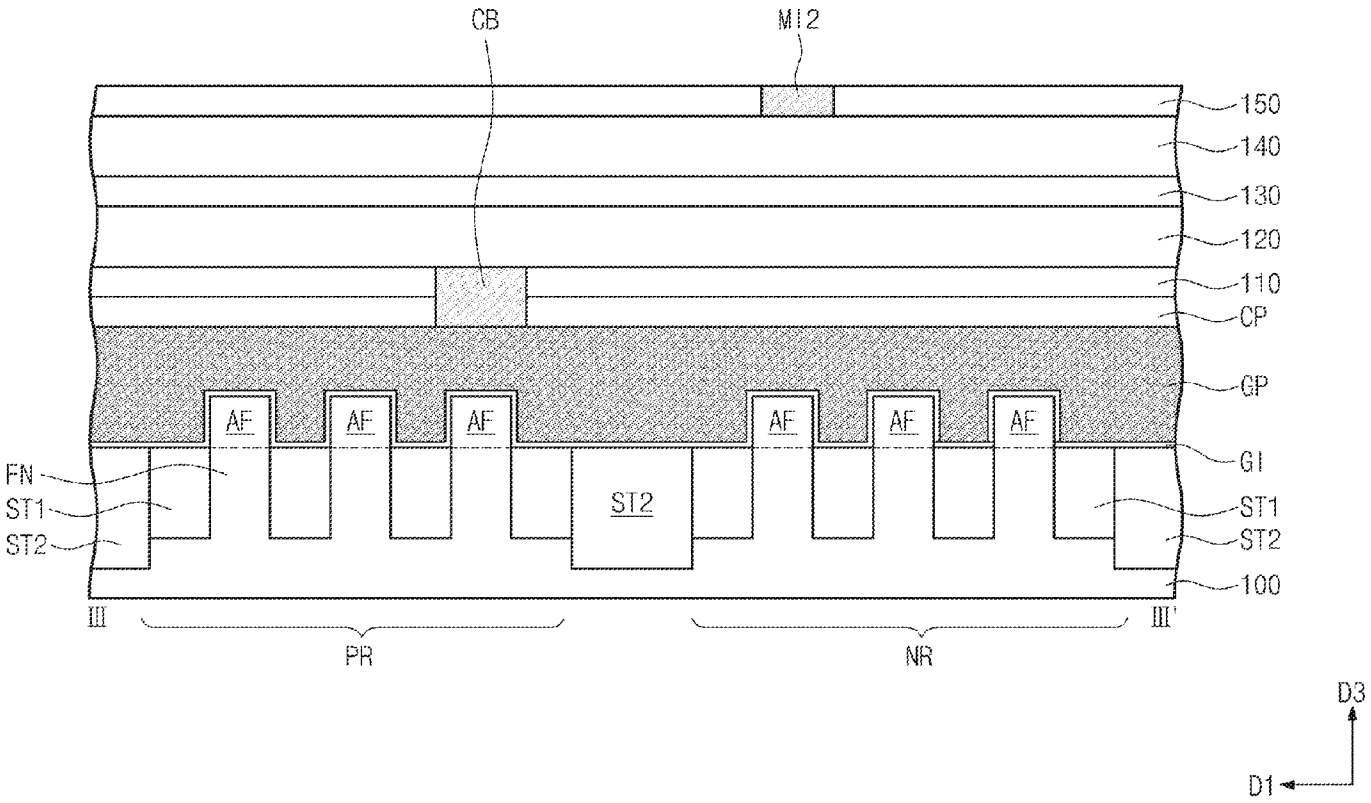
FIG. 20E is a cross-sectional view taken along a line III-III' of FIG. 20A or 20B.

FIGS. 20A and 20B are plan views illustrating semiconductor devices including standard cells having polygonal shapes, according to an exemplary embodiment. In detail, FIG. 20A illustrates the region 'A' of FIG. 10, 11, 12, or 13 in detail. FIG. 20B illustrates a region 'C' of FIG. 14 in detail. FIG. 20C is a cross-sectional view taken along a line I-I' of FIG. 20A or 20B. FIG. 20D is a cross-sectional view taken along a line II-II' of FIG. 20A or 20B. FIG. 20E is a cross-sectional view taken along a line III-III' of FIG. 20A or 20B.

In the exemplary embodiments described with reference to FIGS. 10 to 13, the standard cell SC1 may overlap with (i.e., at least partially include) the second power line PL2, the first NMOS region NR1, the first PMOS region PR1, the first power line PL1, the second PMOS region PR2, the second NMOS region NR2, and the third power line PL3. In the embodiment described with reference to FIG. 14, the standard cell SC1 may overlap with (i.e., at least partially include) the second power line PL2, the first NMOS region NR1, the first PMOS region PR1, the first power line PL1, the second PMOS region PR2, the second NMOS region NR2, the third power line PL3, the third NMOS region NR3, the third PMOS region PR3, and the fourth power line PL4. The standard cell SC1 may have the polygonal shape. In FIGS. 20A and 20B, the boundary of the standard cell SC1 is illustrated by a polygonal line (SC1 boundary), not a straight line parallel to the first direction D1. Hereinafter, the semiconductor device including the standard cell having the polygonal shape and a method for manufacturing the same will be described in detail.

Referring to FIGS. 20A to 20E, a substrate 100 may be provided. For example, the substrate 100 may be a silicon substrate, a germanium substrate, or a silicon-on-insulator (SOI) substrate. Active fin patterns FN may be formed on the substrate 100. The active fin patterns FN may extend in a second direction D2 and may be spaced apart from each other in a first direction D1. First device isolation layers ST1 may be formed between the active fin patterns FN. Second device isolation layers ST2 may be formed in the substrate 100 to define PMOSFET regions PR1 and PR2 and NMOSFET regions NR1 and NR2. In an exemplary embodiment, the first and second device isolation layers ST1 and ST2 may be formed using a shallow-trench isolation (STI) technique. The active fin patterns FN may correspond to portions of the substrate 100 that are defined by the first device isolation layers ST1. For example, the first and second device isolation layers ST1 and ST2 may include silicon oxide.

The first and second device isolation layers ST1 and ST2 may have depths in a direction opposite to a third direction D3. The third direction D3 may be a direction perpendicular to a top surface of the substrate 100. In an exemplary embodiment, the depths of the first device isolation layers ST1 may be shallower than those of the second device isolation layers ST2. The first device isolation layers ST1 may be formed by a process different from a process of forming the second device isolation layers ST2. In an exemplary embodiment, the first and second device isolation layers ST1 and ST2 may be formed at the same time, and the depths of the first device isolation layers ST1 may be substantially equal to those of the second device isolation layers ST2.

Gate electrodes GP may be formed on the active fin patterns FN. The gate electrodes GP may extend in the first direction D1 to intersect the active fin patterns FN. The gate electrodes GP may be spaced apart from each other in the second direction D2. A gate insulating pattern GI may be formed under each of the gate electrodes GP, and gate spacers GS may be formed on both sidewalls of each of the gate electrodes GP. The gate insulating pattern GI may be formed between each of the gate electrodes GP and the active fin patterns FN. In addition, a capping pattern CP may be formed to cover a top surface of each of the gate electrodes GP. A first interlayer insulating layer 110 may be formed to cover the gate electrodes GP.

For example, the gate electrodes GP may include at least one of a semiconductor material doped with dopants, a metal, or a conductive metal nitride. The gate insulating pattern GI may include at least one of silicon oxide, silicon oxynitride, or a high-k dielectric material. The high-k dielectric material may have a dielectric constant higher than that of silicon oxide. Each of the capping pattern CP and the gate spacer GS may include at least one of silicon oxide, silicon nitride, or silicon oxynitride. The first interlayer insulating layer 110 may include at least one of a silicon oxide layer or a silicon oxynitride layer.

Source/drain regions SD may be formed on the active fin patterns FN at both sides of each of the gate electrodes GP. The source/drain regions SD may be doped with P-type or N-type dopants. In an exemplary embodiment, the source/drain regions SD may be formed by performing an ion implantation process on the active fin patterns FN using the gate electrodes GP as an ion implantation mask.

In an exemplary embodiment, the source/drain regions SD may include epitaxial patterns formed by a selective epitaxial growth (SEG) process. The source/drain regions SD may include a different semiconductor element than that of the substrate 100. For example, the source/drain regions SD may include a semiconductor element of which a lattice constant is greater or smaller than that of the semiconductor element of the substrate 100. Since the source/drain regions SD include a different semiconductor element from the substrate 100, the source/drain regions SD may apply compressive stress or tensile stress to channel regions AF disposed between the source/drain regions SD. In an exemplary embodiment, when the substrate 100 is a silicon substrate, the source/drain regions SD of the PMOSFET regions PR1 and PR2 may include silicon-germanium (embedded SiGe) or germanium (Ge). The source/drain regions SD of the PMOSFET regions PR1 and PR2 may apply the compressive stress to the channel regions AF of the PMOSFET regions PR1 and PR2. In an exemplary embodiment, when the substrate 100 is a silicon substrate, the source/drain regions SD of the NMOSFET regions NR1 and NR2 may include silicon carbide (SiC). The source/drain regions SD of the NMOSFET regions NR1 and NR2 may apply the tensile stress to the channel regions AF of the NMOSFET regions NR1 and NR2. As a result, the mobility of carriers generated in the channel regions AF may be improved.

Source/drain contacts CA may be formed between the gate electrodes GP. The source/drain contacts CA may be electrically connected to the source/drain regions SD. The source/drain contacts CA may be provided in the first interlayer insulating layer 110. At least one of the source/drain contacts CA may connect some source/drain regions SD arranged along the first direction D1 to each other.

Gate contacts CB may be formed in an upper portion of the first interlayer insulating layer 110. Each of the gate contacts CB may penetrate the capping pattern CP so as to be directly connected to the gate electrode GP. Bottom surfaces of the gate contacts CB may be disposed at a higher level than bottom surfaces of the source/drain contacts CA. In addition, the bottom surfaces of the gate contacts CB may be disposed at a higher level than top surfaces of the source/drain regions SD.

A second interlayer insulating layer 120 may be formed on the first interlayer insulating layer 110. A third interlayer insulating layer 130 may be formed on the second interlayer insulating layer 120. A first power line PL1 may be formed in the third interlayer insulating layer 130. The first power line PL1 may extend in the second direction D2. Power supplied through the first power line PL1 may be provided to the source/drain regions SD. For example, a power voltage or a ground voltage may be provided through the first power line PL1. In an exemplary embodiment, the second, third and fourth power lines PL2, PL3 and PL4 of FIGS. 10 to 14 may be formed simultaneously with the first power line PL1. A fourth interlayer insulating layer 140 may be formed on the third interlayer insulating layer 130.

A fifth interlayer insulating layer 150 may be formed on the fourth interlayer insulating layer 140. Conductive line holes MH1 and MH2 penetrating the fifth interlayer insulating layer 150 may be formed by a patterning process including a photolithography process using a photomask and an etching process. A first conductive line hole MH1 may extend in the first direction D1. Some portions of a second conductive line hole MH2 may extend in the first direction D1 and another portion of the second conductive line hole MH2 may extend in the second direction D2 (see a conductive line MI2 of FIG. 20A). For example, the second conductive line hole MH2 may have a zigzag shape that may be realized by the change in design for forming the standard cell having the polygonal shape, as described with reference to FIGS. 6 to 9.

In more detail, forming the conductive line holes MH1 and MH2 may include manufacturing the photomask using a pattern group, forming a photoresist pattern on the fifth interlayer insulating layer 130 by the photolithography process using the photomask, and etching the fifth interlayer insulating layer 150 using the photoresist pattern as an etch mask to form the conductive line holes MH1 and MH2.

Thereafter, the conductive line holes MH1 and MH2 may be filled with a conductive material, thereby forming conductive lines MI1 and MI2 corresponding to conductive patterns M1 and M2 illustrated in FIGS. 10 to 13.

Figure 21:
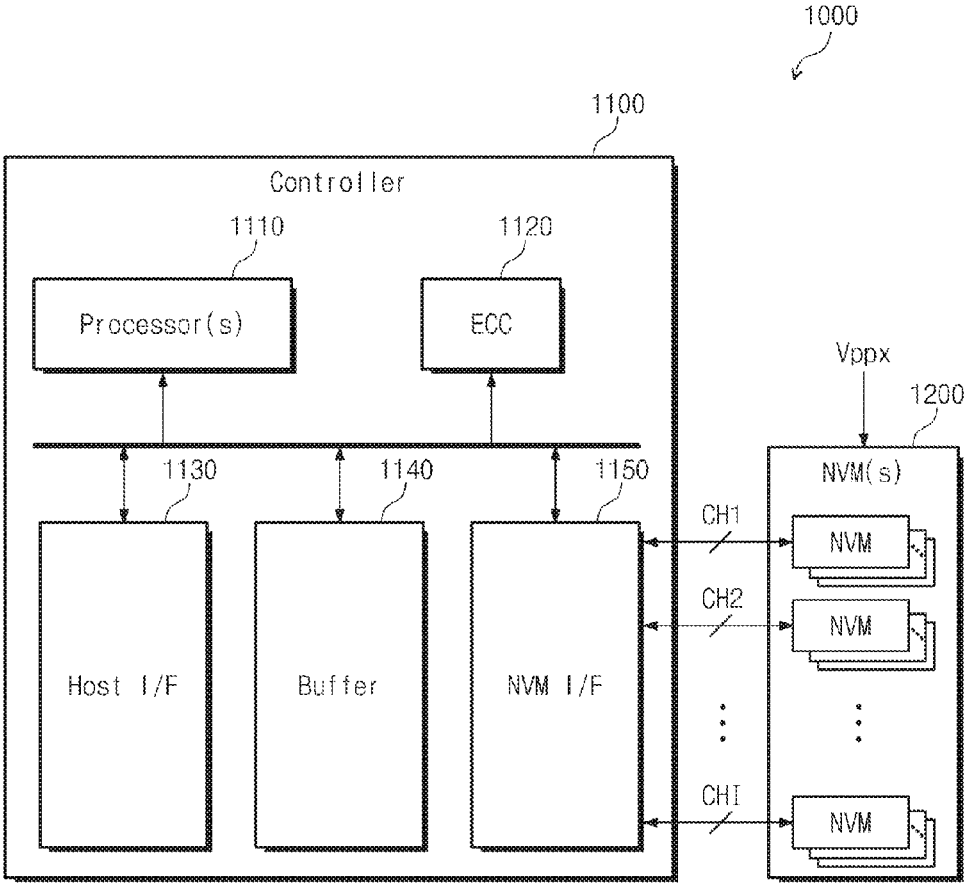
FIG. 21 is a schematic block diagram illustrating a solid state drive (SSD) implemented with a method for designing a layout of a semiconductor device, according to an exemplary embodiment.

FIG. 21 is a schematic block diagram illustrating an SSD implemented with a method for designing a layout of a semiconductor device, according to an exemplary embodiment. Referring to FIG. 21, an SSD 1000 may include a controller 1100 and a plurality of non-volatile memories (NVM) 1200. At least one of the controller 1100 or the NVMs 1200 may include the semiconductor device manufactured according to the layout designing method described above. For example, at least one of the controller 110 or the NVMs 1200 is manufactured based on the standard cell having the polygonal shape, and, thus, may have a layout area smaller than that of a related art semiconductor device.

The controller 1100 may be connected to the NVMs 1200 through a plurality of channels CH1 to CHI (i.e., "I" is an integer of 2 or more). The NVMs 1200 connected to the controller 1100 through the same channel may be provided in the form of a multi-stack chip package. In an exemplary embodiment, the NVMs 1200 may receive an external high-voltage Vppx. The controller 1100 may include at least one processor 1110, an error correction circuit (ECC) 1120, a host interface (UF) 1130, a buffer 1140, and an NM I/F 1150.

The host I/F 1130 may provide an interface function for interfacing with an external device. For example, the host I/F 1130 may be a NAND flash interface unit. In an exemplary embodiment, the host I/F 1130 may be implemented by one or more of other various interfaces. The error correction circuit (ECC) 1120 may calculate a value of an error correction code of data to be programmed in a writing operation and may correct data read in a reading operation based on the value of the error correction code. In addition, the ECC 1120 may correct an error of data recovered from the NVMs 1200 in a data recovery operation. Although not illustrated, the SSD 1000 may further include a code memory which stores code data for operating the controller 1100. The code memory may be implemented with a non-volatile memory. The buffer 1140 may temporarily store data for operating the controller 1100. The buffer 1140 may temporarily store data to be programmed to the NVMs 1200 or may temporarily store data which was read from the NVMs 1200. The NVM I/F 1150 may provide an interface function between the controller 1100 and the NVMs 1200.

According to an exemplary embodiment, since the standard cell having the polygonal shape, except a quadrilateral shape, is provided in the process of designing the layout of the semiconductor device, the size of the semiconductor device may be reduced.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:

a standard cell for forming a logic element, the standard cell *being provided from a cell library and* including:

a first active region including a first PMOS region and a first NMOS region that are spaced apart from each other in a first direction and extend in a second direction on a substrate, the second direction being perpendicular to the first direction;

a second active region including a second PMOS region and a second NMOS region that extend in the second direction on the substrate and are spaced apart from each other in the first direction;

gate electrodes which intersect the first active region and the second active region in the first direction and are spaced apart from each other in the second direction;

first source regions and first drain regions formed on the first active region at both sides of each of the gate electrodes in the second direction;

second source regions and second drain regions formed on the second active region at both sides of each of the gate electrodes in the second direction; and a first power line extending in the second direction between the first active region and the second active region when viewed in a plan view, wherein a boundary of the standard cell has a polygonal shape, excluding a quadrilateral shape, when an entirety of the boundary viewed in the plan view.

2. The semiconductor device of claim 1, wherein the standard cell further comprises:

a second power line extending in the second direction, the first active region including a first edge adjacent to the first power line and a second edge opposite to the first edge and adjacent to the second power line; and a third power line extending in the second direction, the second active region including a first edge adjacent to the first power line and a second edge opposite to the first edge and adjacent to the third power line, wherein the boundary of the standard cell overlaps with the first power line, the second power line, and the third power line.

3. The semiconductor device of claim 2, wherein the standard cell further comprises:

a first region having a first quadrilateral shape and overlapping with the first power line, the second power line, and the third power line; and a second region having a second quadrilateral shape and overlapping with the first power line and the third power line, wherein the second region is in contact with the first region, and shares a sub-boundary with the first region.

4. The semiconductor device of claim 3, wherein the standard cell further comprises a third region having a third quadrilateral shape and overlapping with the first power line and the third power line, the first region includes a first edge which extends in the first direction, and a second edge which extends in the first direction and is opposite to the first edge, the second region is in contact with the first edge of the first region, and the third region is in contact with the second edge of the first region.

5. The semiconductor device of claim 3, wherein the standard cell further comprises a fourth region having a fourth quadrilateral shape and overlapping with the first power line and the second power line, the first region includes a first edge which extends in the first direction, and a second edge which extends in the first direction and is opposite to the first edge, the second region is in contact with the first edge of the first region, and the fourth region is in contact with the second edge of the first region.

6. The semiconductor device of claim 3, wherein the standard cell further comprises a fifth region having a fifth quadrilateral shape and overlapping with the first power line, the second power line, and the third power line, the second region includes a first edge which extends in the first direction, a second edge which extends in the first direction and is opposite to the first edge, the first region is in contact with the first edge of the second region, and the fifth region is in contact with the second edge of the second region.

7. The semiconductor device of claim 2, wherein the first PMOS region and the second PMOS region are adjacent to the first power line.

8. The semiconductor device of claim 4, wherein the standard cell further comprises:

a third active region which extends adjacent to the third power line on the substrate, and includes a third PMOS region and a third NMOS region that extend in the second direction and are spaced apart from each other in the first direction, the gate electrodes further extending to intersect the third active region;

third source regions and third drain regions formed on the third active region at both sides of each of the gate electrodes in the second direction; and a fourth power line extending in the second direction, wherein the third active region includes a first edge which extends in the second direction adjacent to the third power line, and a second edge which is opposite to the first edge and extends in the second direction adjacent to the fourth power line, the standard cell further comprises a sixth region having a sixth quadrilateral shape and overlapping with the third power line and the fourth power line, and the sixth region is in contact with the first region.

9. The semiconductor device of claim 8, wherein the second NMOS region and the third NMOS region are adjacent to the third power line.

10. A semiconductor device comprising:

a standard cell for forming a logic element, the standard cell *being provided from a cell library and* including:

an NMOS region and a PMOS region which are spaced apart from each other in a first direction and extend in a second direction on a substrate, the second direction being perpendicular to the first direction;

gate electrodes which intersect the NMOS region and the PMOS region in the first direction and are spaced apart from each other in the second direction;

source regions and drain regions formed on the NMOS region and the PMOS region at both sides of each of the gate electrodes in the second direction;

a first power line extending in the second direction adjacent to a first edge of the NMOS region;

a second power line extending in the second direction adjacent to a second edge of the PMOS region;

a first region having a first quadrilateral shape and overlapping with the first power line and the second power line; and a second region having a second quadrilateral shape and overlapping with the second power line and the PMOS region, the second region not overlapping the first power line, wherein a boundary of the standard cell has a polygonal shape excluding a quadrilateral shape.

11. The semiconductor device of claim 10, wherein the NMOS region and the PMOS region are disposed between the first power line and the second power line when viewed in a plan view.

12. The semiconductor device of claim 11, wherein the second region is in contact with the first region, and shares a sub-boundary with the first region.

13. The semiconductor device of claim 12, wherein the standard cell further comprises a third region having a third quadrilateral shape and overlapping with the second power line and the PMOS region, the first region includes a first edge being in contact with the second region and a second edge opposite to the first edge, and the third region is in contact with the second edge of the first region.

14. The semiconductor device of claim 12, wherein the standard cell further comprises a fourth region having a fourth quadrilateral shape and overlapping with the first power line and the NMOS region, the first region includes a first edge being in contact with the second region and a second edge opposite to the first edge, and the fourth region is in contact with the second edge of the first region.

15. The semiconductor device of claim 12, wherein the standard cell further comprises a fifth region having a fifth quadrilateral shape and overlapping with the first power line and the second power line, the second region includes a first edge being in contact with the first region and a second edge opposite to the first edge, and the fifth region is in contact with the second edge of the second region.

16. An integrated circuit comprising:

a cell which is *provided from a cell library and* defined on a semiconductor substrate and includes an outer boundary configurable to form a polygonal shape, the cell further including, within the outer boundary:

a first PMOS region and a first NMOS region that are spaced apart from each other in a first direction and extend in a second direction on a substrate, the first direction being perpendicular to the second direction;

a second PMOS region and a second NMOS region that are spaced apart from each other in the first direction and extend in the second direction on the substrate;

gate electrodes which are spaced apart from each other in the second direction and extend in the first direction, each of the gate electrodes overlying the first PMOS region, the first NMOS region, the second PMOS region and the second NMOS region; and source regions and drain regions formed on the first PMOS region and the first NMOS region at both sides of each of the gate electrodes in the second direction, wherein the outer boundary of the cell does not form a quadrilateral shape, when the outer boundary is viewed in a plan view.

17. The integrated circuit of claim 16, wherein the outer boundary of the cell includes at least five individual continuous sides connected to one another for forming the polygonal shape.

18. The integrated circuit of claim 16, wherein the cell comprises a plurality of regions included within the outer boundary, and each of the plurality of regions is in contact with a neighboring region, of the plurality of regions, along a sub-boundary which delineates each of the plurality of regions from the neighboring region.

19. The integrated circuit of claim 18, wherein the cell further comprises:

a first power line extending in the second direction between the first PMOS region and the second PMOS region;

a second power line extending in the second direction at a first outer boundary of the first NMOS region; and a third power line extending in the second direction at a second outer boundary of the second NMOS region.

20. The integrated circuit of claim 19, wherein the plurality of regions includes:

a first region defined on a first area of the semiconductor substrate and having a first quadrilateral shape, the first region including, within a first sub-boundary of the first quadrilateral shape, the first PMOS region, the first NMOS region, the second PMOS region, the second NMOS region, the first power line, the second power line, and the third power line; and a second region defined on a second area of the semiconductor substrate to share the first sub-boundary with the first region and having a second quadrilateral shape, the second region including, within a second sub-boundary of the second quadrilateral shape, the second PMOS region and the second NMOS region, the first power line, and the third power line.

*21. The semiconductor device of claim 2, wherein a distance between the first and second power lines is different from a distance between the first and third power lines.*

*22. The semiconductor device of claim 1, wherein the standard cell further comprises at least one active fin pattern formed on the substrate.*

*23. The semiconductor device of claim 1, further comprising a conductive line extending in the first direction across the first power line.*

*24. The semiconductor device of claim 1, further comprising a gate contact formed within at least one of the first active region or the second active region.*

*25. A semiconductor device comprising:*

*a first row comprising:*

*a first active region including a first active sub-region and a second active sub-region that are spaced apart from each other in a first direction and extend in a second direction on a substrate, the second direction being perpendicular to the first direction; and*

*a first source region and a first drain region formed on the first active region at both sides of a first gate electrode in the second direction;*

*a second row comprising:*

*a second active region including a third active sub-region and a fourth active sub-region that extend in the second direction on the substrate and are spaced apart from each other in the first direction; and*

*a second source region and a second drain region formed on the second active region at both sides of a second gate electrode in the second direction;*

*a first power line extending in the second direction between the first active region and the second active region, wherein the first power line is disposed between the second active sub-region and the third active sub-region;*

*a second power line extending in the second direction, wherein the second power line is adjacent to the first active sub-region; and*

*a third power line extending in the second direction, wherein the third power line is adjacent to the fourth active sub-region;*

*wherein a height of the first row is different from a height of the second row;*

*wherein at least one standard cell is placed over the first row and the second row.*

*26. The semiconductor device of claim 25, wherein the first active sub-region and the fourth active sub-region comprise a first type of transistor, and the second active sub-region and the third active sub-region comprise a second type of transistor.*

*27. The semiconductor device of claim 25, wherein the first active sub-region and the fourth active sub-region comprise NMOS, and the second active sub-region and the third active sub-region comprise PMOS.*

*28. The semiconductor device of claim 25, wherein the first active sub-region and the fourth active sub-region comprise PMOS, and the second active sub-region and the third active sub-region comprise NMOS.*

*29. The semiconductor device of claim 25, wherein the first gate electrode and the second gate electrode are connected to each other.*

*30. The semiconductor device of claim 25, wherein at least one of the first gate electrode or the second gate electrode intersects the first active region and the second active region in the first direction.*

*31. The semiconductor device of claim 25, wherein a first standard cell is placed on the first row and a second standard cell is placed on the second row.*

*32. The semiconductor device of claim 25, wherein power supplied through the first power line is provided to at least one of the first source region, the first drain region, the second source region and the second drain region.*

*33. The semiconductor device of claim 25, wherein a power voltage or a ground voltage is provided through the first power line.*

*34. The semiconductor device of claim 25, wherein the at least one standard cell further comprises at least one active fin pattern formed on the substrate.*

*35. The semiconductor device of claim 34, wherein the at least one active fin pattern comprises at least two active fin patterns, and*

*wherein the at least two active fin patterns extend in the second direction and are spaced apart from each other in the first direction.*

*36. The semiconductor device of claim 34, wherein the at least one active fin pattern comprises at least two active fin patterns, and*

*wherein an isolation layer is formed between the at least two active fin patterns.*

*37. The semiconductor device of claim 34, wherein at least one of the first gate electrode or the second gate electrode is formed on the at least one active fin pattern, extends in the first direction to intersect the at least one active fin pattern.*

*38. The semiconductor device of claim 25, further comprising a conductive line extending in the first direction across the first power line.*

*39. The semiconductor device of claim 25, wherein at least one of the first gate electrode or the second gate electrode intersects at least one of the first, second or third power lines.*

*40. The semiconductor device of claim 25, further comprising a gate contact formed within at least one of the first active region or the second active region.*

*41. The semiconductor device of claim 25, further comprising a gate insulating pattern formed under at least one of the first gate electrode or the second gate electrode, wherein the gate insulating pattern comprises a high-k dielectric material.*

*42. The semiconductor device of claim 25, wherein the at least one standard cell has a polygonal shape.*

*43. The semiconductor device of claim 25, further comprising a capping pattern formed to cover a top surface of at least one of the first gate electrode or the second gate electrode.*

*44. The semiconductor device of claim 25, wherein the first or second source/drain region comprises epitaxial patterns.*

*45. The semiconductor device of claim 25, wherein the at least one standard cell is a multi-height cell.*

*46. The semiconductor device of claim 25, wherein a width of the at least one standard cell is greater than a height of the at least one standard cell.*

*47. A semiconductor device comprising:*

*a first row comprising a first active region including a first active sub-region and a second active sub-region that are spaced apart from each other in a first direction and extend in a second direction on a substrate, the second direction being perpendicular to the first direction;*

*a second row comprising a second active region including a third active sub-region and a fourth active sub-region that extend in the second direction on the substrate and are spaced apart from each other in the first direction; and*

*a gate electrode that extends in the first direction, and intersects the first active sub-region, the second active sub-region, the third active sub-region and the fourth active sub-region,*

*wherein a height of the first row is different from a height of the second row, and*

*wherein at least one standard cell is placed over the first row and the second row.*

*48. The semiconductor device of claim 47, wherein the first row further comprises a first source region and a first drain region formed on the first active region at both sides of a gate electrode, and the second row further comprises a second source region and a second drain region formed on the second active region at both sides of the gate electrode.*

*49. The semiconductor device of claim 47, further comprising:*

*a first power line extending in the second direction between the first active region and the second active region, wherein the first power line is disposed between the second active sub-region and the third active sub-region;*

*a second power line extending in the second direction, wherein the second power line is adjacent to the first active sub-region; and*

*a third power line extending in the second direction, wherein the third power line is adjacent to the fourth active sub-region.*

*50. The semiconductor device of claim 49, wherein power supplied through the*

*first power line is provided to a source/drain region.*

*51. The semiconductor device of claim 49, wherein a power voltage or a ground voltage is provided through the first power line.*

*52. The semiconductor device of claim 47, wherein the second row is in contact with the first row, and shares a boundary with the first row.*

*53. The semiconductor device of claim 47, wherein the first active region and the second active region are spaced apart from each other in the second direction.*

*54. The semiconductor device of claim 47, wherein a first standard cell is placed on the first row and a second standard cell is placed on the second row.*

*55. The semiconductor device of claim 47, further comprising at least one active fin pattern formed on the substrate.*

*56. The semiconductor device of claim 55, wherein the at least one active fin pattern comprises at least two active fin patterns, and*

*wherein the at least two active fin patterns extend in the second direction and are spaced apart from each other in the first direction.*

*57. The semiconductor device of claim 55, wherein the at least one active fin pattern comprises at least two active fin patterns, and*

*wherein an isolation layer is formed between the at least two active fin patterns.*

*58. The semiconductor device of claim 55, wherein a gate electrode is formed on the at least one active fin pattern, extends in the first direction to intersect the at least one active fin pattern.*

*59. A semiconductor device comprising:*

*a first standard cell, a second standard cell and a third standard cell comprising:*

*a first row comprising a first active region and a second active region;*

*a second row comprising a third active region and a fourth active region;*

*a third row comprising a fifth active region and a sixth active region, wherein the first row, the second row, and the third row are spaced apart from each other in a first direction and extend in a second direction on a substrate;*

*a first power line extending in the second direction, wherein the first power line is disposed between the second active region and the third active region;*

*a second power line extending in the second direction, wherein the second power line is adjacent to the first active region; and*

*a third power line extending in the second direction, wherein the third power line is disposed between the fourth active region and the fifth active region;*

*wherein a distance between the first and second power lines is different from a distance between the first and third power lines,*

*wherein the first standard cell is a single-height standard cell, and*

*wherein the second standard cell is a multi-height standard cell.*

*60. The semiconductor device of claim 59, wherein the third standard cell is a multi-height standard cell.*

*61. The semiconductor device of claim 59, wherein the second standard cell comprises four active regions.*

*62. The semiconductor device of claim 59, wherein the second standard cell comprises three active regions.*

*63. The semiconductor device of claim 59, wherein the third standard cell comprises six active regions.*

*64. The semiconductor device of claim 59, wherein the first active region and the fourth active region comprise a first type of transistor, and the second active region and the third active region comprise a second type of transistor.*

* * * * *